US008035116B2

(12) United States Patent
Ogihara et al.

(10) Patent No.: US 8,035,116 B2
(45) Date of Patent: Oct. 11, 2011

(54) SEMICONDUCTOR DEVICE, LIGHT EMITTING DIODE HEAD, AND IMAGE FORMING APPARATUS

(75) Inventors: Mitsuhiko Ogihara, Tokyo (JP); Hiroyuki Fujiwara, Tokyo (JP); Masataka Muto, Tokyo (JP); Takahito Suzuki, Tokyo (JP); Tomoki Igari, Tokyo (JP)

(73) Assignee: Oki Data Corporation, Tokyo (JP)

( * ) Notice: Subject to any disclaimer, the term of this patent is extended or adjusted under 35 U.S.C. 154(b) by 279 days.

(21) Appl. No.: 11/896,829

(22) Filed: Sep. 6, 2007

(65) Prior Publication Data
US 2008/0063431 A1 Mar. 13, 2008

(30) Foreign Application Priority Data
Sep. 12, 2006 (JP) ................ 2006-247275

(51) Int. Cl.
*H01L 29/18* (2006.01)
(52) U.S. Cl. .............. 257/88; 257/79; 257/690; 257/26; 257/E25.032; 438/31; 438/34; 438/28
(58) Field of Classification Search .................. 257/668, 257/79, 690, 26, 65
See application file for complete search history.

(56) References Cited

U.S. PATENT DOCUMENTS

| 5,895,965 A * | 4/1999 | Tanaka et al. ............... 257/668 |
| 6,037,612 A * | 3/2000 | Nishimura et al. ........... 257/103 |
| 2006/0180818 A1 * | 8/2006 | Nagai et al. .................... 257/89 |
| 2006/0192214 A1 * | 8/2006 | Ogihara et al. ................ 257/79 |

FOREIGN PATENT DOCUMENTS

JP 10-035011 2/1998

* cited by examiner

*Primary Examiner* — Thanh V Pham
*Assistant Examiner* — Mark A Laurenzi
(74) *Attorney, Agent, or Firm* — Kubotera & Associates, LLC

(57) ABSTRACT

A semiconductor device includes a substrate; a first conductive type semiconductor layer disposed on a main surface of the substrate; a second conductive type semiconductor layer disposed on the first conductive type semiconductor layer; a plurality of light emitting elements; and a second conductive side wiring pattern for commonly connecting the second conductive type semiconductor layer in the light emitting elements arranged adjacently. The second conductive type semiconductor layer includes a first conductive type semiconductor connection surface and a second conductive type semiconductor connection surface between the first conductive type semiconductor layer.

24 Claims, 31 Drawing Sheets

SEMICONDUCTOR DEVICE, LIGHT EMITTING DIODE HEAD, AND IMAGE FORMING APPARATUS

BACKGROUND OF THE INVENTION AND RELATED ART STATEMENT

The present invention relates to a semiconductor device of a light emitting diode (LED) array and the likes, in which a plurality of light emitting elements is arranged; a light emitting diode (LED) head including the semiconductor device; and an image forming apparatus including the light emitting diode (LED) head.

In a conventional image forming apparatus such as a printer using electro-photography technology, a plurality of light emitting diodes (LEDs) is arranged to form an LED array chip, and a plurality of the LED array chips is arranged to form a light emitting diode (LED) head. Recently, it has been required that an image forming apparatus such as a printer forms an image with high resolution. Accordingly, the number of the light emitting elements in the LED print head has increased drastically.

In the LED array chip, an impurity is diffused in a surface of a semiconductor compound wafer (such as GaAs) through solid phase diffusion to form a plurality of p-n connection areas. A wiring pattern is connected to an upper layer of the p-n connection areas for switching ON/OFF. A common layer is disposed at a lower side (intermediate side of the substrate) of the p-n connection areas (refer to Patent Reference).
Patent Reference Japanese Patent Publication No. 10-035011

In the conventional LED array chip, the p-n connection areas have a very small size. Accordingly, it is necessary to reduce a size of the wiring pattern as well for securing insulation between the adjacent p-n connection areas. Further, the wiring pattern is connected to an electrode pad to be connected to a drive element over a relatively long distance, thereby increasing a potential difference between connecting portions and lowering energy efficiency.

In view of the problems described above, an object of the present invention is to provide a semiconductor device with improved energy efficiency and lowered resistance in a wiring pattern. A further object of the present invention is to provide an LED head using the semiconductor device, and an image forming apparatus having the LED head as an exposure device.

Further objects and advantages of the invention will be apparent from the following description of the invention.

SUMMARY OF THE INVENTION

In order to attain the objects described above, according to the present invention, a semiconductor device includes a substrate; a first conductive type semiconductor layer disposed on a main surface of the substrate; a second conductive type semiconductor layer disposed on the first conductive type semiconductor layer. The second conductive type semiconductor layer includes a first conductive type semiconductor connection surface and a second conductive type semiconductor connection surface between the first conductive type semiconductor layer.

Further, the semiconductor device further includes a plurality of light emitting elements; and a second conductive side wiring pattern for commonly connecting the second conductive type semiconductor layer of the light emitting elements arranged adjacently in a specific number.

According to the present invention, the first conductive type semiconductor layer may be electrically divided on the main surface of the substrate with respect to each of the light emitting elements.

According to the present invention, the semiconductor device may further include an insulation layer disposed between the substrate and the first conductive type semiconductor layer electrically divided with respect to each of the light emitting elements. The substrate may be formed of a conductive material, and the second conductive side wiring pattern is connected to the substrate.

According to the present invention, the semiconductor device may further include a conductive layer disposed on the main surface of the substrate and an insulation layer disposed between the conductive layer and the first conductive type semiconductor layer electrically divided with respect to each of the light emitting elements. The second conductive side wiring pattern is connected to the conductive layer.

According to the present invention, the second conductive side wiring pattern may be formed of a transparent electrode. The semiconductor device may further include a wiring pattern formed of a transparent electrode and a metal wiring pattern for supplying power to the second conductive side wiring pattern.

According to the present invention, the semiconductor device may include the substrate formed of a semiconductor compound. The first conductive type semiconductor layer and the second conductive type semiconductor layer are grown epitaxially from the substrate.

According to the present invention, the semiconductor device may further include an integrated circuit area disposed on the substrate for driving the light emitting elements.

According to the present invention, a light emitting diode (LED) head includes the semiconductor device described above; a drive circuit for selectively driving the light emitting elements; and a supporting member for supporting the semiconductor device and the drive circuit.

According to the present invention, an image forming apparatus includes a photosensitive drum; a charging device for charging a surface of the photosensitive drum; the LED head described above for selectively exposing the surface of the photosensitive drum to form a static latent image; and a developing device for developing the static latent image.

In the present invention, the first conductive type semiconductor layer and the second conductive type semiconductor layer are disposed on the substrate, so that it is possible to shear a common electrode connection structure of the second conductive type semiconductor layer. Accordingly, it is possible to reduce a wiring pattern length of an electrode connection structure of the first conductive type semiconductor layer as well. As a result, it is possible to minimize voltage drop due to wiring resistance, thereby improving energy efficiency of the image forming apparatus as a whole.

In the semiconductor device of the present invention, when the light emitting elements are a selective diffusion type for emitting light in a range from red to infra read, it is preferred to diffuse a p-type impurity into an n-type semiconductor layer, as opposed to diffusing an n-type impurity into a p-type semiconductor layer, due to a lower annealing temperature in a diffusion process. Accordingly, it is possible to easily produce a diffused area with a lower resistivity, and to produce an LED array with improved element characteristics.

DETAILED DESCRIPTION OF PREFERRED EMBODIMENTS

Hereunder, preferred embodiments of the present invention will be explained with reference to the accompanying drawings. The present invention is related to a semiconductor device, a LED head, and an image forming apparatus. It should be noted that the drawings are schematic and illustrative so that components of the invention are shown clearly. The drawings do not limit the present invention or represent exact shapes of etched sections, relative sizes or accurate sizes of each component area, thicknesses of semiconductor layers or insulation layers, thicknesses of substrates, and the likes.

First Embodiment

Figure 1:
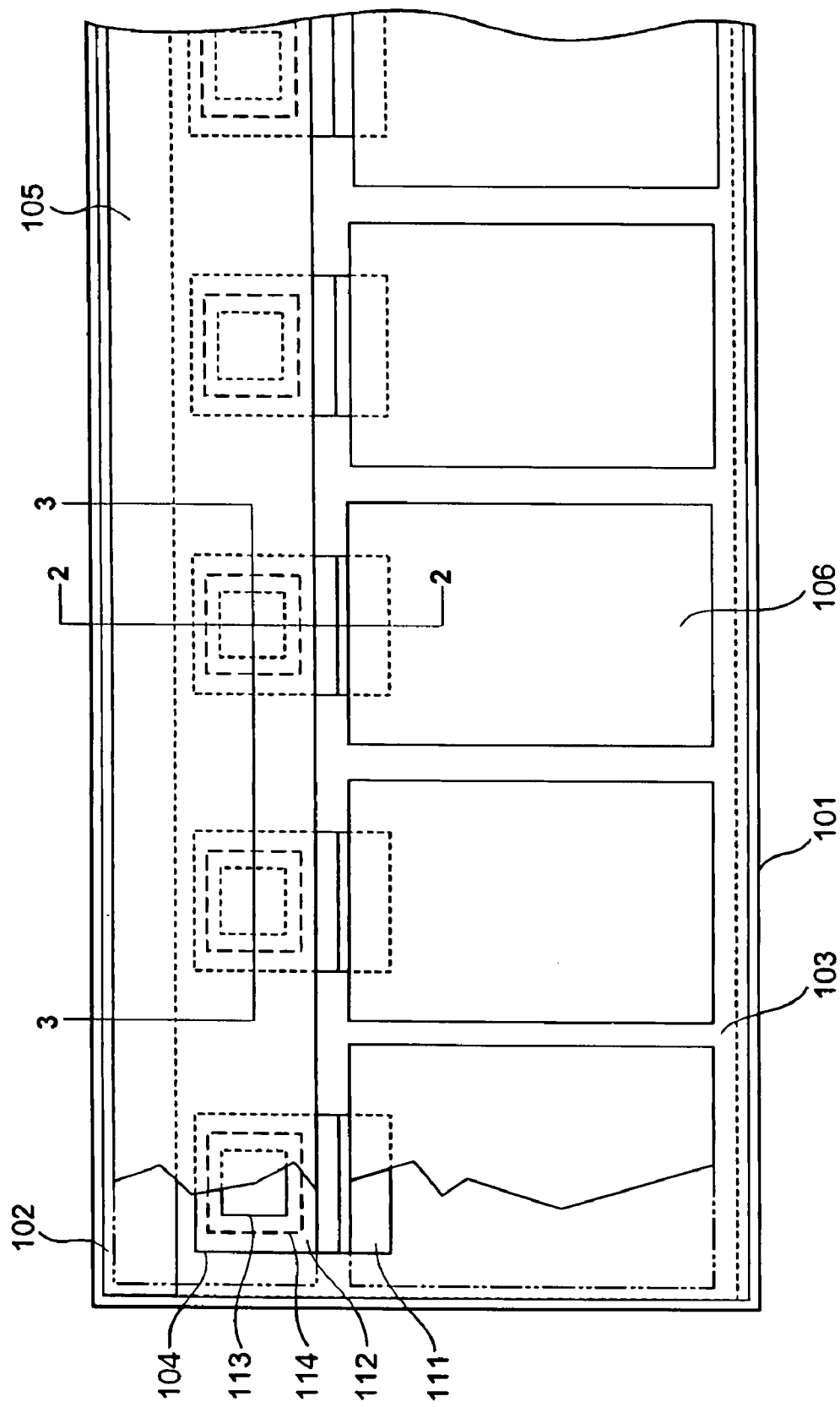
FIG. 1 is a schematic plan view showing a semiconductor device according to the first embodiment of the present invention.
Figure 2:
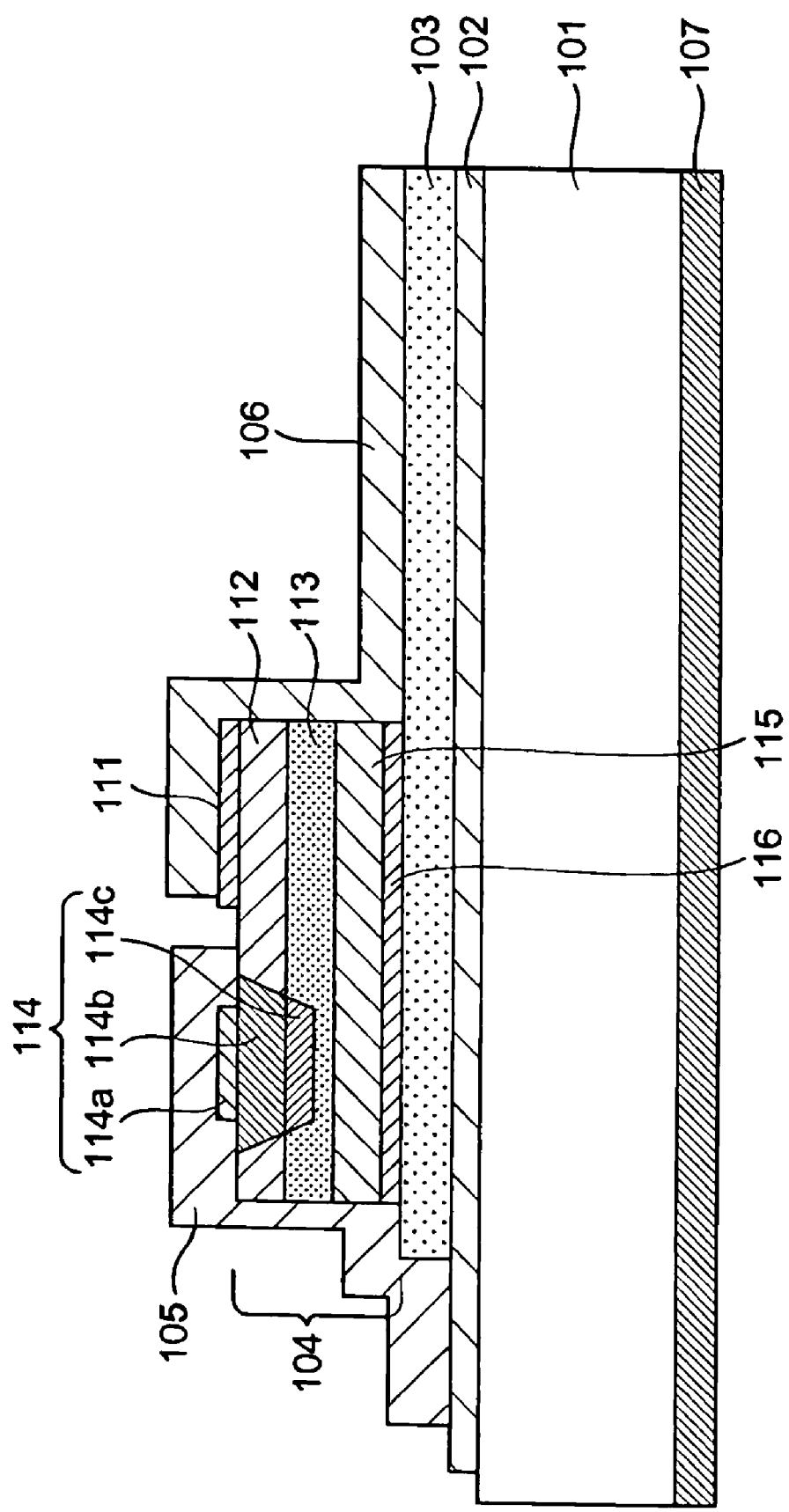
FIG. 2 is a schematic sectional view of the semiconductor device taken along a line 2-2 in FIG. 1 according to the first embodiment of the present invention.
Figure 3:
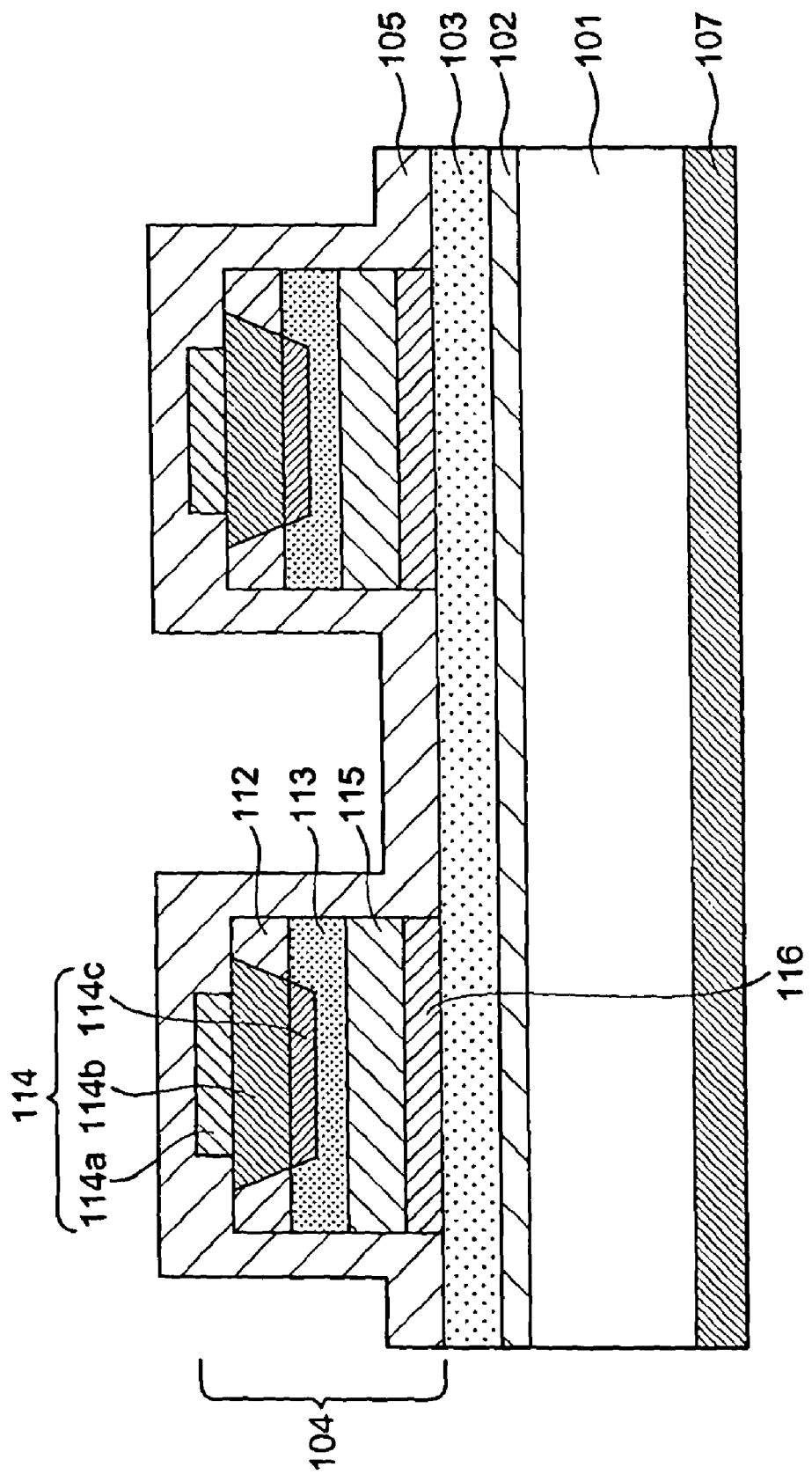
FIG. 3 is a schematic sectional view of the semiconductor device taken along a line 3-3 in FIG. 1 according to the first embodiment of the present invention.

A first embodiment of the present invention will be explained. FIG. 1 is a schematic plan view showing a semiconductor device according to the first embodiment of the present invention. FIG. 2 is a schematic sectional view of the semiconductor device taken along a line 2-2 in FIG. 1 according to the first embodiment of the present invention. FIG. 3 is a schematic sectional view of the semiconductor device taken along a line 3-3 in FIG. 1 according to the first embodiment of the present invention. The semiconductor device is an example of a light emitting diode (LED) array driven through a concurrent drive. The semiconductor device is especially preferred to provide an LED head of an image forming apparatus such as a photoelectric printer.

As shown in FIG. 1 to FIG. 3, a conductive layer 102 made of a metal layer and an insulation layer 103 made of an organic thin layer are laminated on a main surface of a p-type silicon substrate 101. The p-type silicon substrate 101 is electrically conductive as a semiconductor substrate. N-type semiconductor thin layers 104 of a first conductive type are formed on the insulation layer 103. The n-type semiconductor thin layers 104 are, for example, epitaxial growth thin layers with a GaAs/AlGaAs layered structure having an approximate rectangular shape in a plan view. Each of the n-type semiconductor thin layers 104 is isolated from the other adjacent n-type semiconductor thin layers 104 with the same light emitting element.

In the embodiment, a p-side electrode contact layer 105 is provided on the n-type semiconductor thin layers 104. The p-side electrode contact layer 105 is formed of an oxide transparent electrode layer such as ITO, ZnO, or the like in a prescribed pattern (described later). N-side electrode contact layers 106 are provided on the surface where the p-side electrode contact layer 105 is provided. The n-side electrode contact layers 106 constitute rectangular-shaped connection pad portions for a wire bonding. The n-side electrode contact layers 106 are vertically separated from the n-type semiconductor thin layers 104 for connecting to an external circuit.

An area functioning as a light emitting element is concentrated in an area of the n-type semiconductor thin layer 104 (epitaxial growth thin layer). Especially, the n-type semiconductor thin layer 104 or a second conductive semiconductor layer is provided through selectively diffusing p-type impurity. More specifically, the n-type semiconductor thin layer 104 comprises, for example, an n-type GaAs layer 116, an n-type $Al_xGa_{1-x}As$ clad layer 115, an n-type $Al_yGa_{1-y}As$ active layer 113, an n-type $Al_zGa_{1-z}As$ clad layer 112, and an n-type GaAs contact layer 111.

In the embodiment, an impurity such as Zn and the likes is selectively diffused in the n-type semiconductor thin layer 104 to form a p-type semiconductor thin layer 114. The p-type semiconductor thin layer 114 includes a p-type GaAs layer 114a, a p-type $Al_zGa_{1-z}As$ clad layer 114b, and a p-type $Al_yGa_{1-y}As$ active layer 114c, in which x, y, and z, are within rages of $0<x<1$, $0<y<1$, and $0<z<1$, respectively.

The conductive layer 102 may be formed of, i.e. Al, AlSiCu, Ni/Al, Ti/Al, Pd, Cr/Pd, Ti/Pd, Ti, Cu, Ti/Pt/Au, Cr/Au, Ag type alloy, or the like. The insulation layer 103 may be formed of an organic insulation layer, an oxide layer, or a nitride layer. The insulation layer 103 may have a thickness between 10 nm and 1 μm, preferably between 10 nm and 300 nm.

In the embodiment, the p-type semiconductor thin layer 114 has a diffusion front reaching the n-type $Al_yGa_{1-y}As$ active layer 113. The p-type GaAs layer 114a is isolated from the n-type GaAs contact layer 111 in order to avoid a p-n connection. Materials of the semiconductor layers such as the n-type $Al_yGa_{1-y}As$ active layer 113 and the n-type $Al_zGa_{1-z}As$ clad layer 112 may be selected, so that an energy band gap of the active layers becomes smaller than that of the clad layers.

In the embodiment, a p-side electrode layer 107 is provided on a backside of the p-type silicon substrate 101. The p-side electrode layer 107 may be formed of Al, AlSiCu, Ni/Al, Ti/Al, Pd, Cr/Pd, Ti/Pd, Ti, Cu, Ti/Pt/Au, Cr/Au, Ag type alloy, or the like. A thickness of the p-side electrode layer 107 may be, for example, between 100 nm and 2 μm.

In the embodiment, the semiconductor device shown in FIG. 1 functions as the LED array. A common positive potential is supplied to the p-type contact layer 114a of each of the LEDs through the p-side electrode layer 107 provided on the backside, the p-type silicon substrate 101, the conductive layer 102, and the p-side electrode contact layer 105. A switching of an electric potential (i.e. ground potential) setting of the n-side electrode contact layer 106 controls a power supply of each of the LEDs. When the LEDs are turned on according to a voltage applied to the n-side electrode contact layer 106, electrons and electron holes are recombined in the active layer, thereby generating and irradiating light outside.

In the embodiment, the p-type impurity is diffused in the n-type semiconductor layer 104 to form the light emitting area of the LED array. The n-type semiconductor layers 104 are individually divided for each of the LEDs on the surface of the p-type silicon substrate 101. Accordingly, it is possible to set the p-type layer at the common potential and control the power supply of the LED.

Further, the p-side electrode contact layer 105 or the transparent electrode with a low contact resistance is formed on the p-type layer. Accordingly, it is possible to provide the LEDs with high light extraction efficiency. Due to an ohmic characteristic of the transparent electrode, as opposed to the contact resistance with respect to the n-type semiconductor area, it is possible to easily reduce the contact resistance with respect to the p-type semiconductor area. Accordingly, only the wiring patterns formed of the p-type semiconductor areas is explained in the embodiment.

In the embodiment, the LEDs are provided using the semiconductor layers on the insulation layer 103. Accordingly, it is possible to individually provide the LEDs on the insulation layer 103. As a result, it is possible to easily prevent a crosstalk such as a mutual current leak, thereby providing the LEDs with improved quality. Further, a quality of the substrate does not affect a LED element. Accordingly, when the common potential is supplied in the p-type area, the common potential may be supplied from the backside of the silicon substrate formed of a relatively inexpensive material.

Further, the insulation layer 103 is formed on the silicon substrate 101, so that the common electrodes of the p-type semiconductor layers are formed. Accordingly, the common electrodes of the n-type semiconductor layers may have a shorter wire length. As a result, it is possible to minimize a problem such as a potential drop caused by an interconnection resistance, thereby improving energy efficiency of the LED head as a whole.

In the embodiment, the wiring patterns between the p-type contact layers and the metal layer are formed of the transparent electrodes. The wiring patterns may be partially formed of a metal in the areas outside the light emitting area. Further, instead of the transparent electrodes, a contact or a wiring may be formed of a metal without disturbing the basic operation.

In the embodiment, the AlGaAs type semiconductors are used as an example. The semiconductor thin layer may be formed of a III-V type material such as GaAs, $Al_xGa_{1-x}As$, $Al_xGa_yAs_{1-x-y}P$, $Al_xGa_yIn_{1-x-y}P$, or InP. Further, the semiconductor thin layer may be formed of one or a combination of a III-V type nitride such as GaN, $Al_xGa_{1-x}N$, $Ga_xIn_{1-x}N$, $GaAs_{1-x}N_x$, $GaP_{1-x}N_x$, $InAs_{1-x}N_x$, $InP_{1-x}N_x$, $In_xGa_{1-x}As_{1-y}N_y$, $InP_{1-x-y}As_xN_y$, or $InAl_{1-x}N$, in which x and y are within ranges of $1 \geq x \geq 0$ and $1 \geq y \geq 0$, respectively. Still further, the semiconductor thin layer may be formed of an oxide semiconductor such as ZnO.

Second Embodiment

Figure 4:
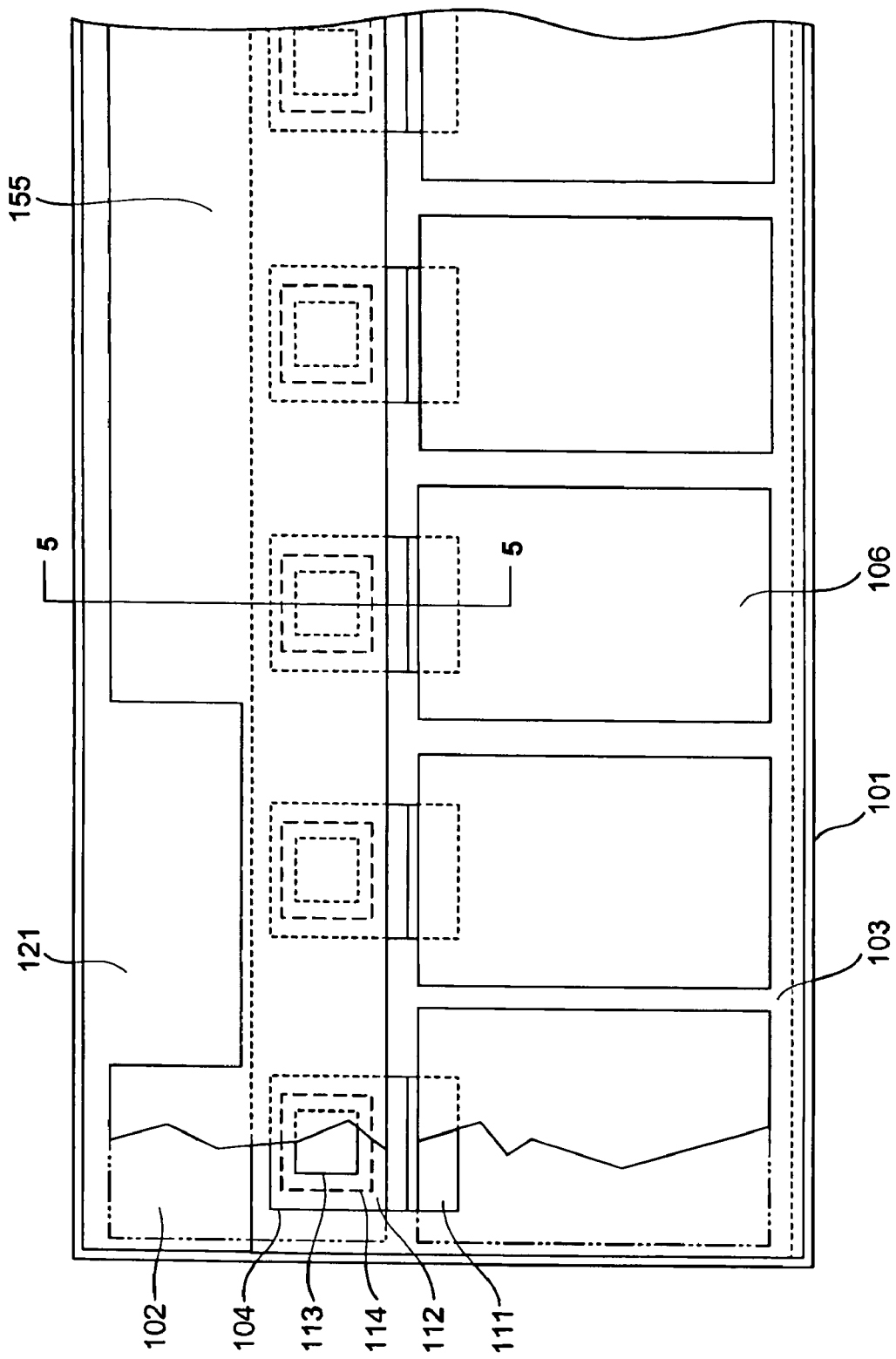
FIG. 4 is a schematic plan view showing a semiconductor device according to a second embodiment of the present invention.
Figure 5:
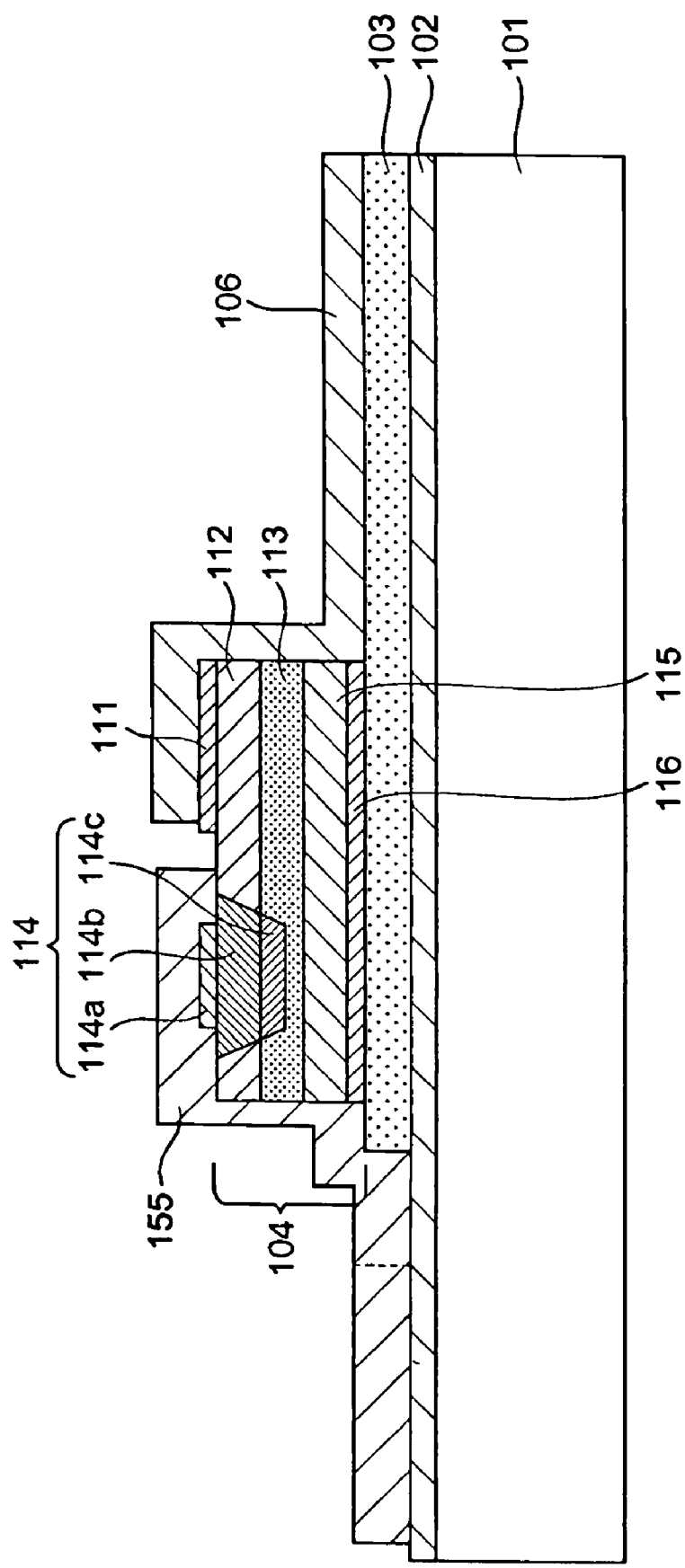
FIG. 5 is a schematic sectional view of the semiconductor device taken along a line 5-5 in FIG. 4 according to the second embodiment of the present invention.
Figure 6:
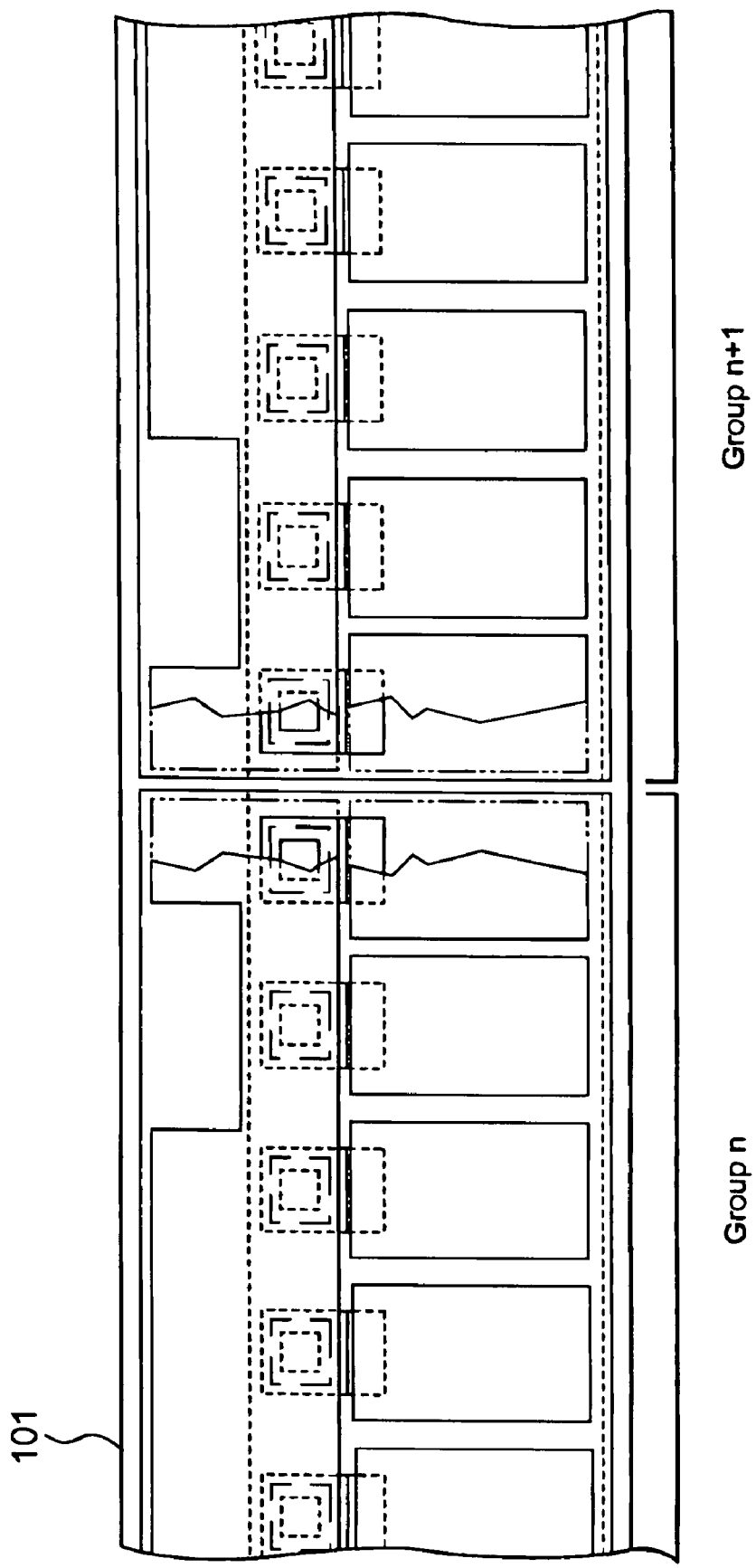
FIG. 6 is a schematic plan view showing the semiconductor devices arranged in a group according to the second embodiment of the present invention.

A second embodiment of the present invention will be explained next. FIG. 4 is a schematic plan view showing a semiconductor device according to the second embodiment of the present invention. FIG. 5 is a schematic sectional view of the semiconductor device taken along a line 5-5 in FIG. 4 according to the second embodiment of the present invention. FIG. 6 is a schematic plan view showing the semiconductor devices arranged in a group according to the second embodiment of the present invention.

As shown in FIGS. 4 and 5, the p-side electrode contact layer 155 is formed partially to expose the conductive layer 102 as a conductive layer exposure area 121 on the main surface of the substrate, so that the common potential is supplied from an upper surface. When the conductive layer exposure area 121 is used to connect externally through a wire bonding or the like, the conductive layer 102 may have a thickness between 500 nm and 1 μm in the conductive layer exposure area 121. The conductive layer 102 may have a thickness under the LED array area different from that in the exposure area to be used as a bonding pad.

In the first embodiment, a part of the LED array driven through the concurrent drive is shown. Alternatively, the semiconductor devices shown in FIG. 4 may be arranged in a pattern, for example, as shown in FIG. 6, in which a plurality of the LED arrays driven through the concurrent drive is arranged on a chip, or the silicon substrate 101 in groups (n, n+1, . . . ).

Third Embodiment

Figure 7:
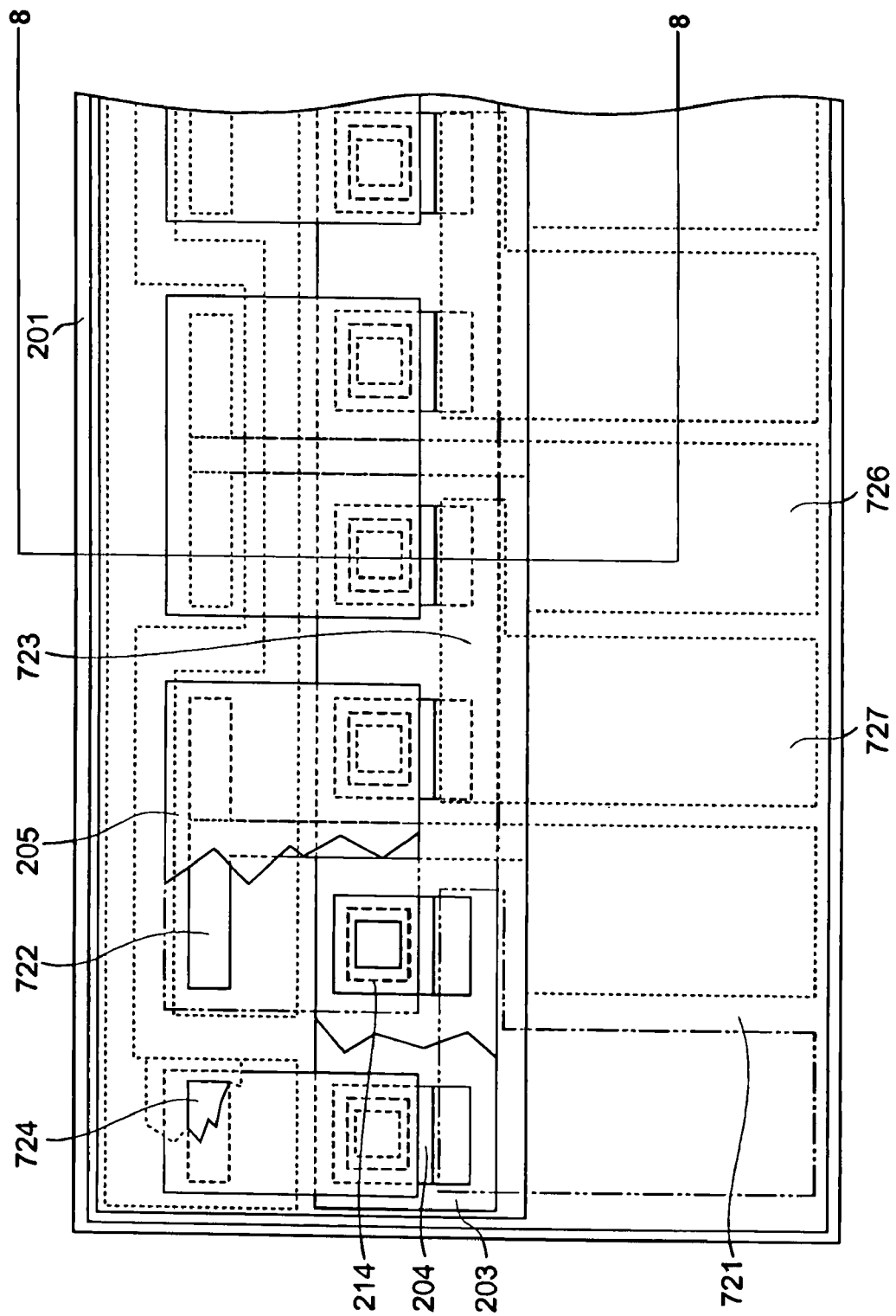
FIG. 7 is a schematic plan view showing a semiconductor device according to a third embodiment of the present invention.
Figure 8:
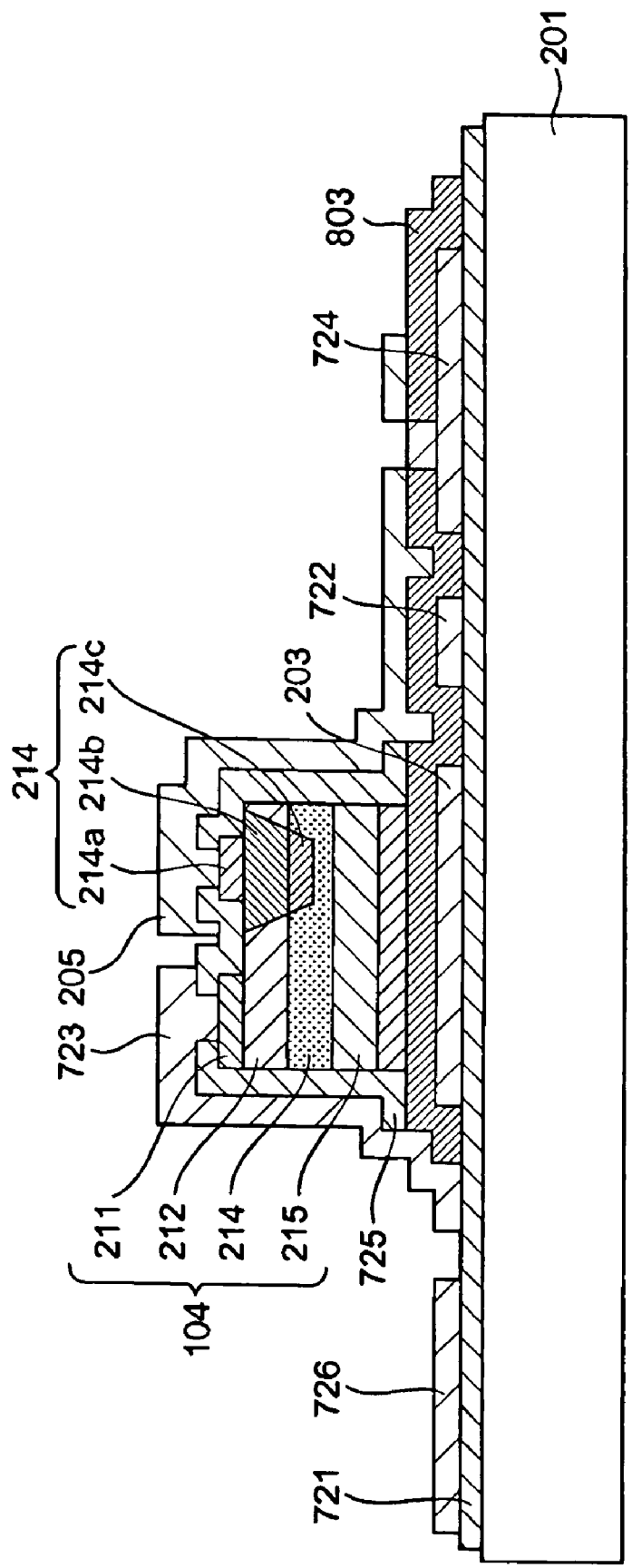
FIG. 8 is a schematic sectional view of the semiconductor device taken along a line 8-8 in FIG. 7 according to the third embodiment of the present invention.

A third embodiment of the present invention will be explained next. FIG. 7 is a schematic plan view showing a semiconductor device according to a third embodiment of the present invention. FIG. 8 is a schematic sectional view of the semiconductor device taken along a line 8-8 in FIG. 7 according to the third embodiment of the present invention.

In the third embodiment, the LED array is a split drive type, while the LED array in the first embodiment is the concurrent drive type.

As shown in FIG. 7, the LED array is divided into two LED blocks. A p-type area of each block is supplied with the common potential, and an n-type area of each LED is supplied with a separate potential through switching. A p-side wiring pattern 722 for supplying the common potential and an n-side wiring pattern 723 for supplying a separate potential are provided on a substrate 201. The p-side wiring pattern 722 is connected to a p-side electrode pad 726, and the n-side wiring pattern 723 is connected to an n-side electrode pad 727.

As shown in FIG. 7, each of the p-side wiring patterns 722 and 724 constitutes a p-side contact group; that is, the p-side contact group of the wiring pattern 722 and the p-side contact group of the wiring pattern 724. The wiring patterns are provided so that each of the p-side wiring patterns contacts with respect to a p-type area of the LED of every other block and each of the p-side wiring patterns does not have a contact point.

As shown in FIG. 8, an interlayer insulation layer 725 covers the n-type semiconductor layer 104. Accordingly, when the n-side electrode pad 727 and the n-side wiring pattern 723 connected to the n-side electrode pad 727 are disposed relatively close to the p-side electrode pad 726, it is possible to prevent electric short.

In the embodiment, the n-type semiconductor layer 104 is a semiconductor thin layer similar to that in the first embodiment, and is divided with respect to the LED. The n-type semiconductor layer 104 has a layer structure and a configuration of the selective diffusion area similar to those in the first embodiment.

As shown in FIG. 8, an insulation layer 803 extends to an area covering the p-side wiring patterns, and may be provided only on the conductive layer 102. In this case, the p-side wiring patterns may be covered with the interlayer insulation layer 725. The interlayer insulation layer 725 may be formed of, for example, an oxide layer or a nitride layer.

As shown in FIG. 7, in the LED array, the common potential is supplied in the p-type area of the LED group (a pair of LEDs) in one block through the p-side electrode pad 726. Each LED is controlled to turn on and off through switching the n-side electrode pad.

In the third embodiment, each thin-layered LED is formed of the common potential block group through the p-side wiring patterns. Accordingly, in addition to the effect in the first embodiment, there are advantages such as a reduced electric crosstalk among the common potential blocks and a better control of the split control drive.

In the embodiment, a pair of LEDs is regarded as one block. The number of LEDs in one block may be adjustable. Further, the wire length and the positions of the pads are not limited to the embodiment, and may be varied.

Fourth Embodiment

Figure 9:
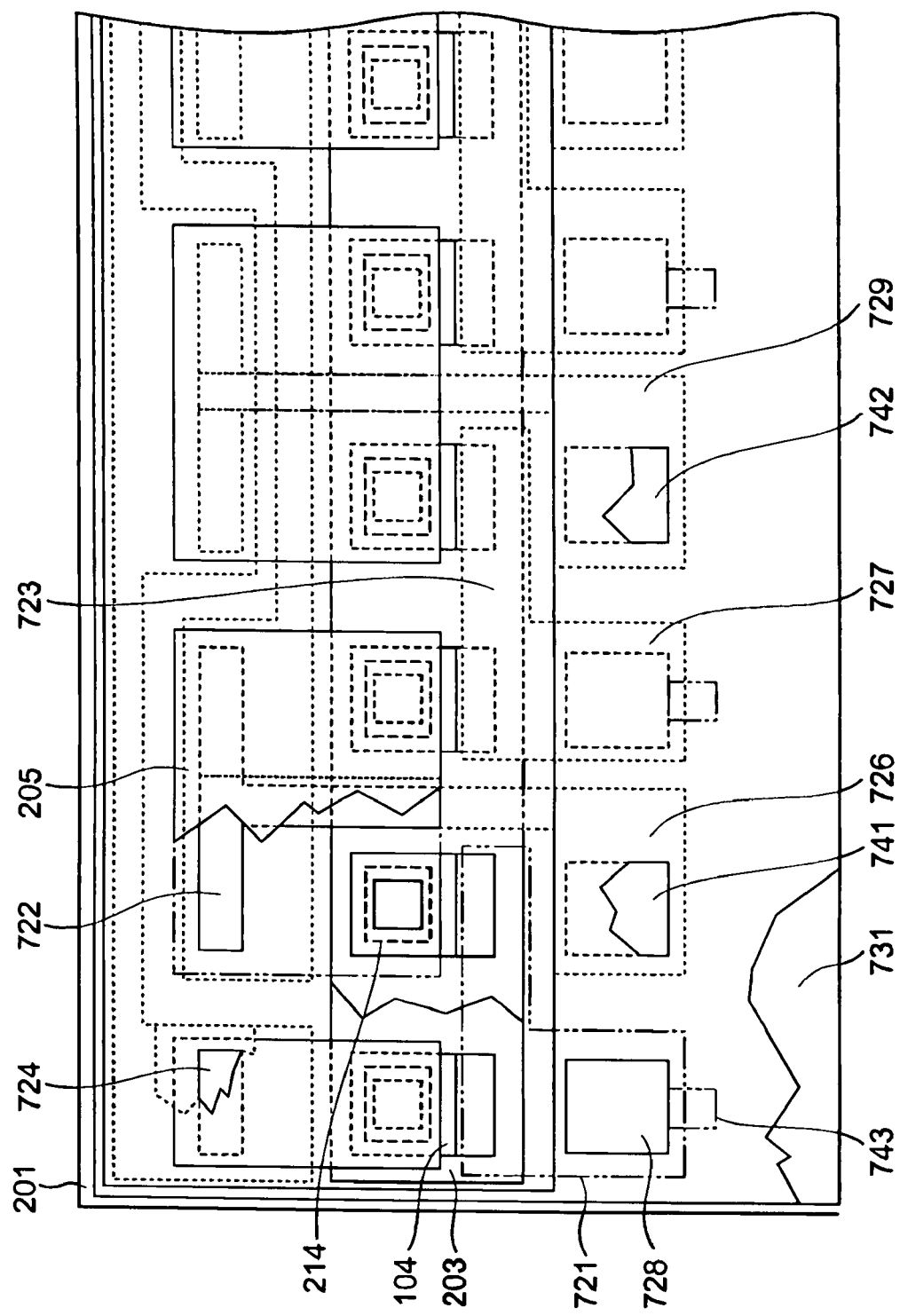
FIG. 9 is a schematic plan view showing a semiconductor device according to a fourth embodiment of the present invention.

A fourth embodiment of the present invention will be explained next. FIG. 9 is a schematic plan view showing a semiconductor device according to the fourth embodiment of the present invention. Different from the third embodiment, in the fourth embodiment, the LED array is disposed on the substrate 201 having an integrated circuit area 731 thereon. The p-side wiring patterns 722 and 724 and the n-side wiring patterns 727 are connected to an integrated circuit formed in the integrated circuit area 731 through pads provided on the integrated circuit.

A configuration of the semiconductor thin layer, the wiring patterns, and configurations and materials of the p-side block group and the wiring patterns may be the same as those in the third embodiment. Further, a drive integrated circuit on the substrate 201 controls the drive of the LED array, and the basic ON/OFF control is similar to that in the first and second embodiments described above.

According to the semiconductor device in the fourth embodiment of the present invention, the individual LED in a thin layer shape constitutes the common potential block group through p-side wiring patterns. The LED array similar to that in the third embodiment is provided on the substrate 201 having the integrated circuit area 731 thereon. Further, the p-side wiring patterns 722 and 724 and n-side wiring 727 on the integrated circuit are connected to the integrated circuit through the pads formed on the integrated circuit.

Accordingly, in addition to the effects in the first and second embodiments, the advantages of the embodiment include minimizing the size of the integrated circuit area and reducing the chip width substantially. Accordingly, the element may be highly integrated and may produce images with high definition when used in the LED head.

Fifth Embodiment

Figure 10:
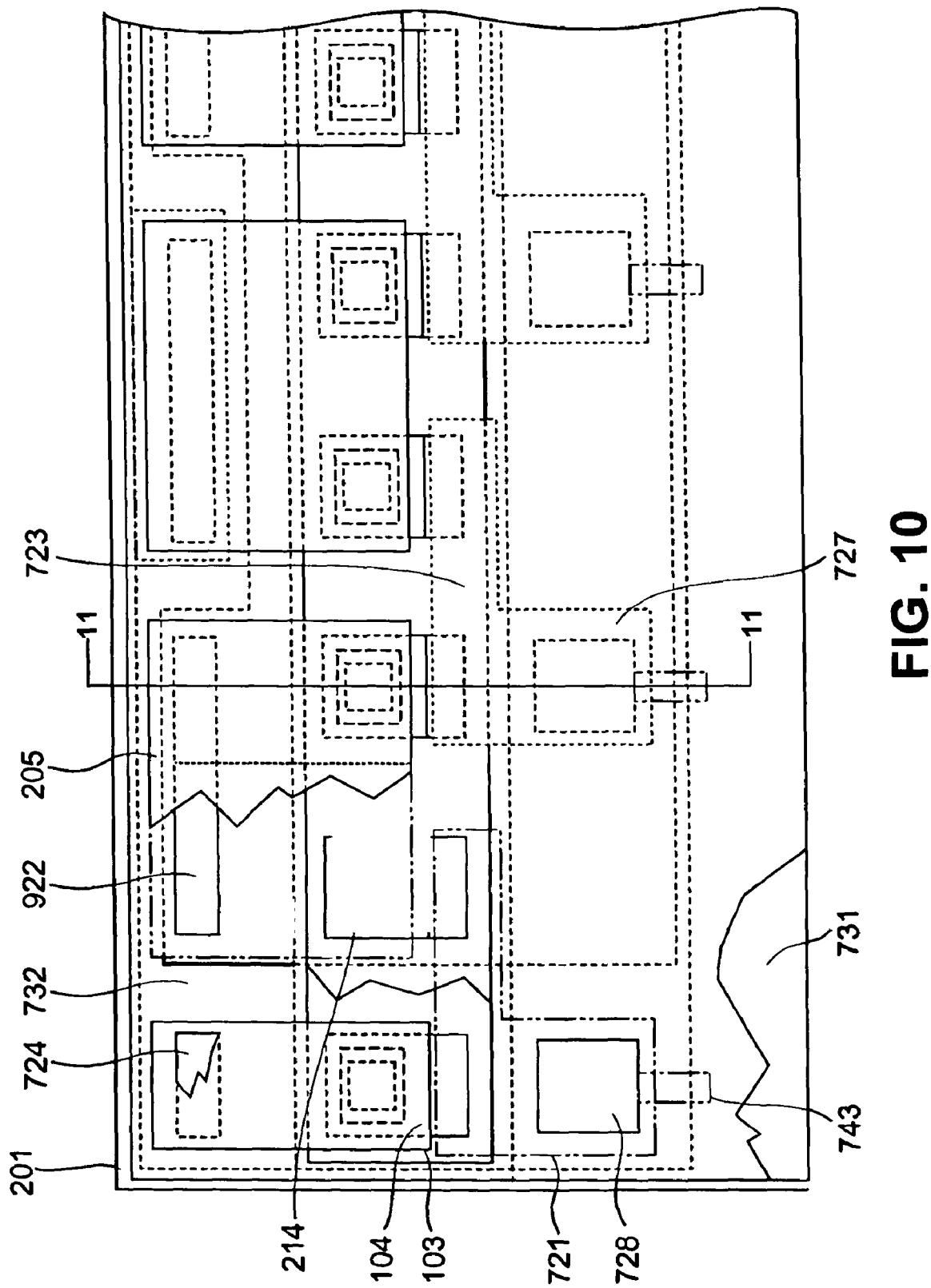
FIG. 10 is a schematic plan view showing a semiconductor device according to a fifth embodiment of the present invention.
Figure 11:
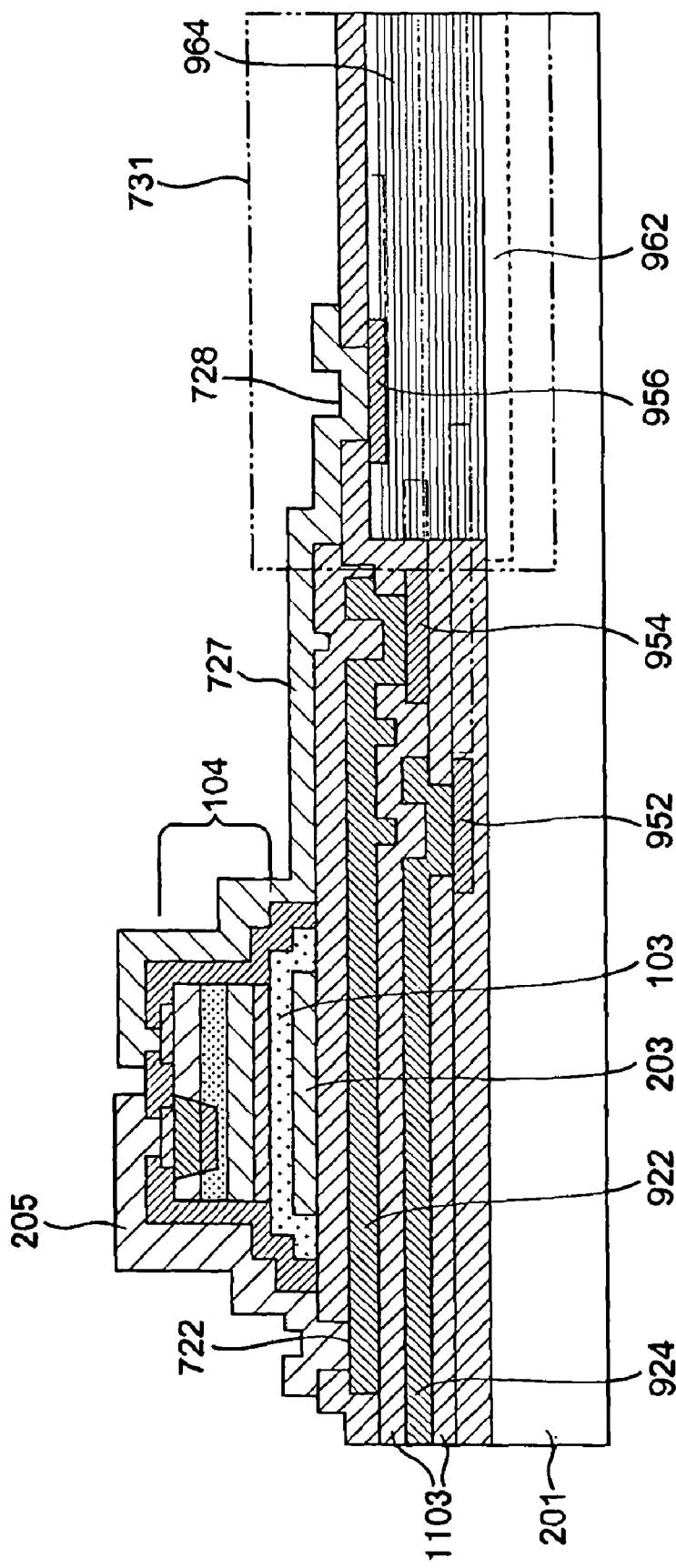
FIG. 11 is a sectional view of the semiconductor device taken along a line 11-11 in FIG. 10.

A fifth embodiment of the present invention will be explained next. FIG. 10 is a schematic plan view showing a semiconductor device according to a fifth embodiment of the present invention. FIG. 11 is a sectional view of the semiconductor device taken along a line 11-11 in FIG. 10. Different from the fourth embodiment, wiring layers of the first p-side wiring pattern group and the second p-side pattern group to connect with the drive IC are provided in a lower layer of the semiconductor thin layer.

As shown in FIG. 11, interlayer insulation layers 1103 are formed on the substrate 201, and sandwich a wiring layer 924 and a p-side wiring layer 922. The first wiring layer 924 connects the fist p-side wiring pattern group and the drive IC, while the second wiring layer 922 connects the second p-side wiring pattern group and the drive IC. The wiring layers 922 and 924 are connected with the integrated circuit area 731 in a connection area 952 and a connection area 954, respectively. In the integrated circuit area 731, the IC that drives the LED array is formed.

Further, an FET area 962 and a multilayer wiring area 964 are provided on the substrate 201. A configuration of the semiconductor layer 104 is similar to that in the previous embodiments. A conductive layer 203 formed of a metal layer is provided through the insulation layer 103 just below the semiconductor 104. The n-side wiring pattern 727 is connected to the integrated circuit in a connection area 728, while the p-side wiring pattern 205 is connected to the wiring layer 922 in a connection area 722.

In the fifth embodiment, the individual LED in the thin layer shape constitutes the common potential block group through the p-side wiring patterns. The LED array similar to that in the third embodiment is provided on the substrate 201 having the integrated circuit area 731 thereon. The p-side wiring pattern groups 722 and 724 having a flat structure without patterns are provided in the lower layers of the semiconductor thin layer, thereby improving reliability of the insulation layers between the wiring patterns and reducing an electric crosstalk. Further, the wiring layers without patterns are provided with the insulation layer 103 therebetween, thereby improving flatness of the lower portion of the semiconductor thin layer. The semiconductor thin layer is provided in the flat area, thereby improving reliability of the LED.

Sixth Embodiment

Figure 12:
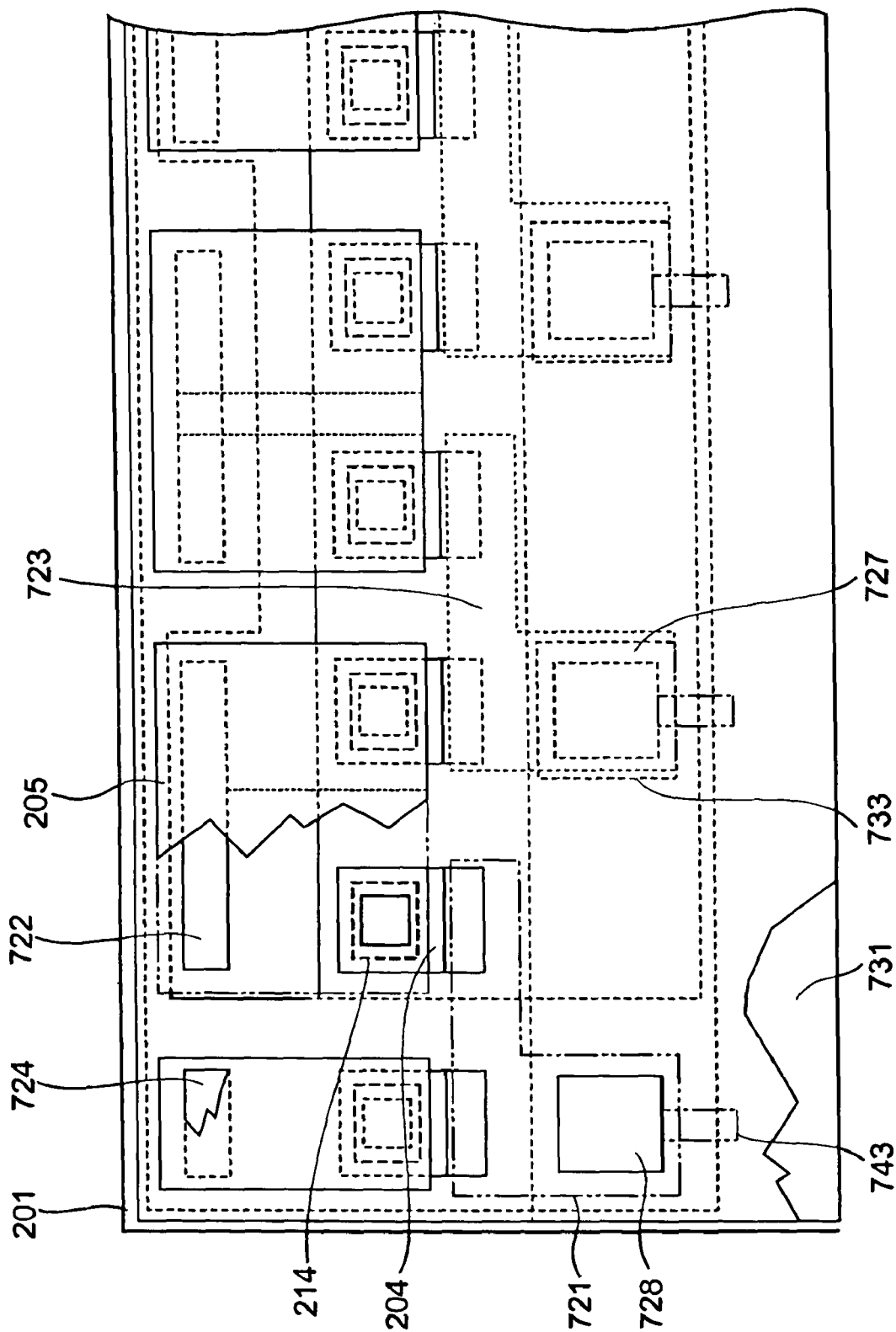
FIG. 12 is a schematic plan view showing a semiconductor device according to a sixth embodiment of the present invention.

A sixth embodiment of the present invention will be explained next. FIG. 12 is a schematic plan view showing a semiconductor device according to the sixth embodiment of the present invention. As shown in FIG. 12, the metal layer (conductive layer 203) is omitted from the semiconductor device in the fifth embodiment shown in FIG. 11. In this case, the wiring layer (for example, corresponding to the wiring layers 924 and 922 shown in FIG. 11) is provided in the lower portion, so that light reflects toward the backside thereof effectively. Further, a production process may be simplified, and a dimensional accuracy of a micro-fabrication may be improved.

Seventh Embodiment

Figure 13:
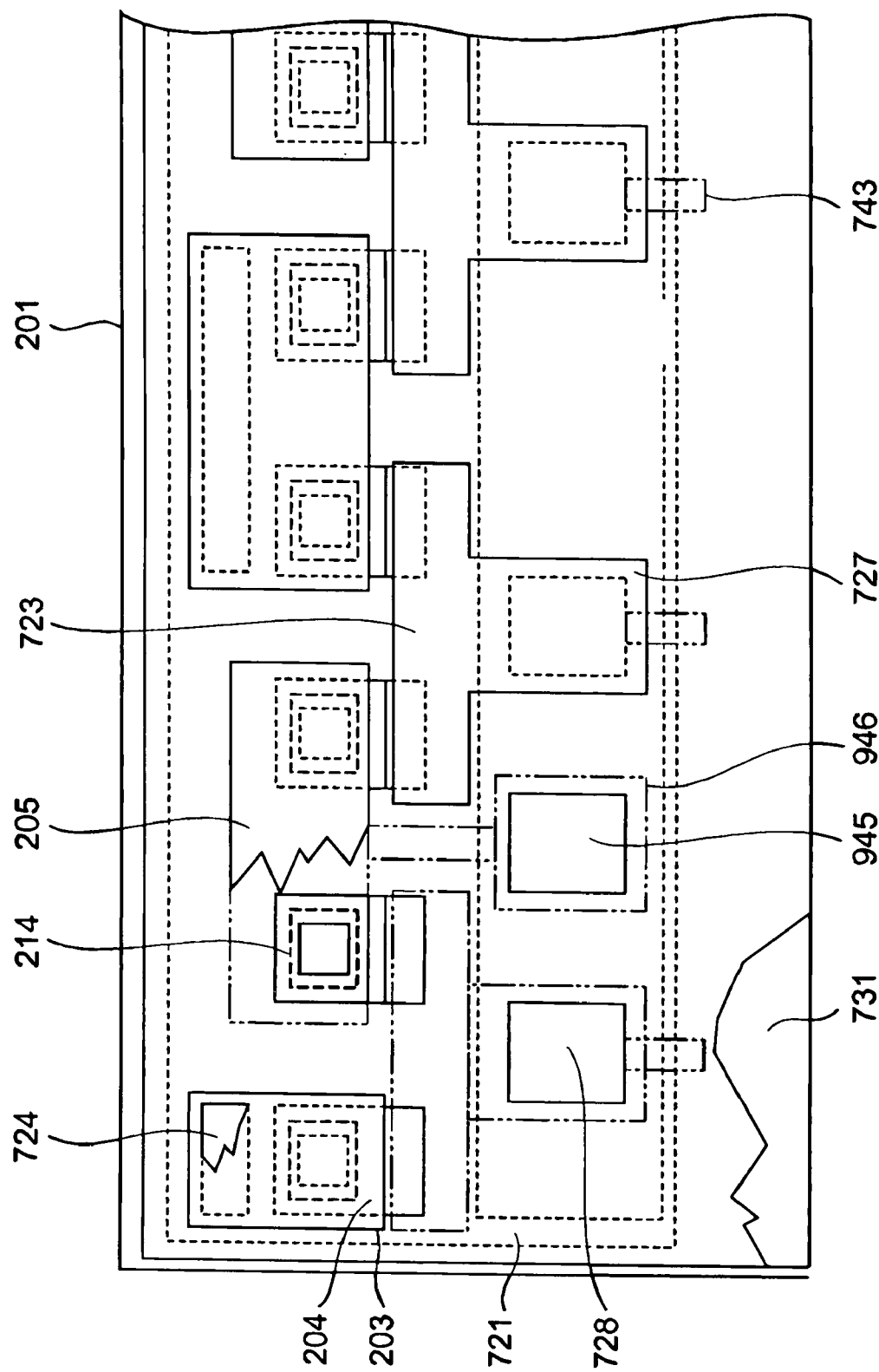
FIG. 13 is a schematic plan view showing a semiconductor device according to a seventh embodiment of the present invention.

A seventh embodiment of the present invention will be explained next. FIG. 13 is a schematic plan view showing a semiconductor device according to the seventh embodiment of the present invention. In the seventh embodiment, a layout of a wiring connection between the p-side wiring pattern group and the drive integrated circuit is different from that in the third and fifth embodiments.

In the seventh embodiment, the second p-side wiring pattern group 724 (p-side block group) is connected to the drive integrated circuit through the wiring layer 924 (refer to FIG. 11) provided in the lower portion of the semiconductor thin layer. The first p-side block group is connected to the integrated circuit area 731 in a connection area 945 through a wiring layer 946 at an upper layer. The configurations and materials described in the above embodiments may be used to form the semiconductor layer 104, the p-side electrode contact layer 205 (transparent electrode), the n-side electrode contact layer 723, the interlayer insulation layer 1103, the conducting layer (a reflection layer such as a metal layer) 102, and the insulation layer 103 and the like.

In the seventh embodiment, the wiring layers 946 and 924 are divided into the lower layer and the upper layer of the semiconductor thin layer with respect to a plurality of the p-side wiring pattern groups. The wiring layers 946 and 924 are provided to connect to the drive integrated circuit. Accordingly, in addition to the effects of the first to fifth embodiments, an advantage gained in the seventh embodiment is that the number of the multilayered wiring layers to constitute the drive integrated circuit may be reduced, thereby reducing the cost.

Eighth Embodiment

Figure 14:
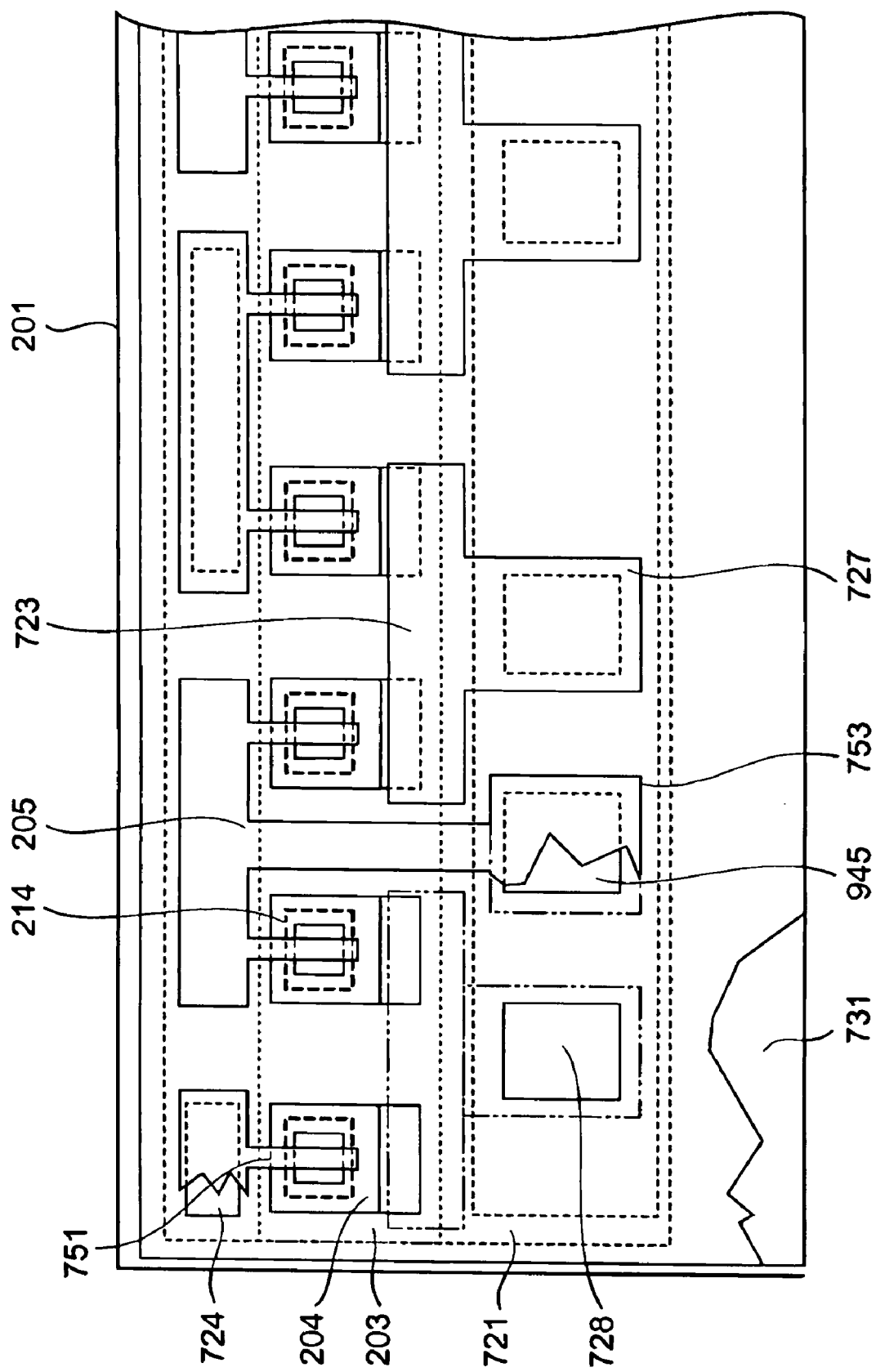
FIG. 14 is a schematic plan view showing a semiconductor device according to an eighth embodiment of the present invention.

An eighth embodiment of the present invention will be explained next. FIG. 14 is a schematic plan view showing a semiconductor device according to the eighth embodiment of the present invention. The eighth embodiment is a modified example of the seventh embodiment. In the seventh embodiment, the p-side contact 205 is formed of a transparent electrode. In the eighth embodiment, as shown in FIG. 14, a contact 751 and a wiring layer 752 formed of a metal member are provided.

In the eighth embodiment, similar modifications may be available. For example, a p-side contact may be formed of the transparent electrode material, and the wiring pattern 752 may be formed of a metal member.

Ninth Embodiment

Figure 15:
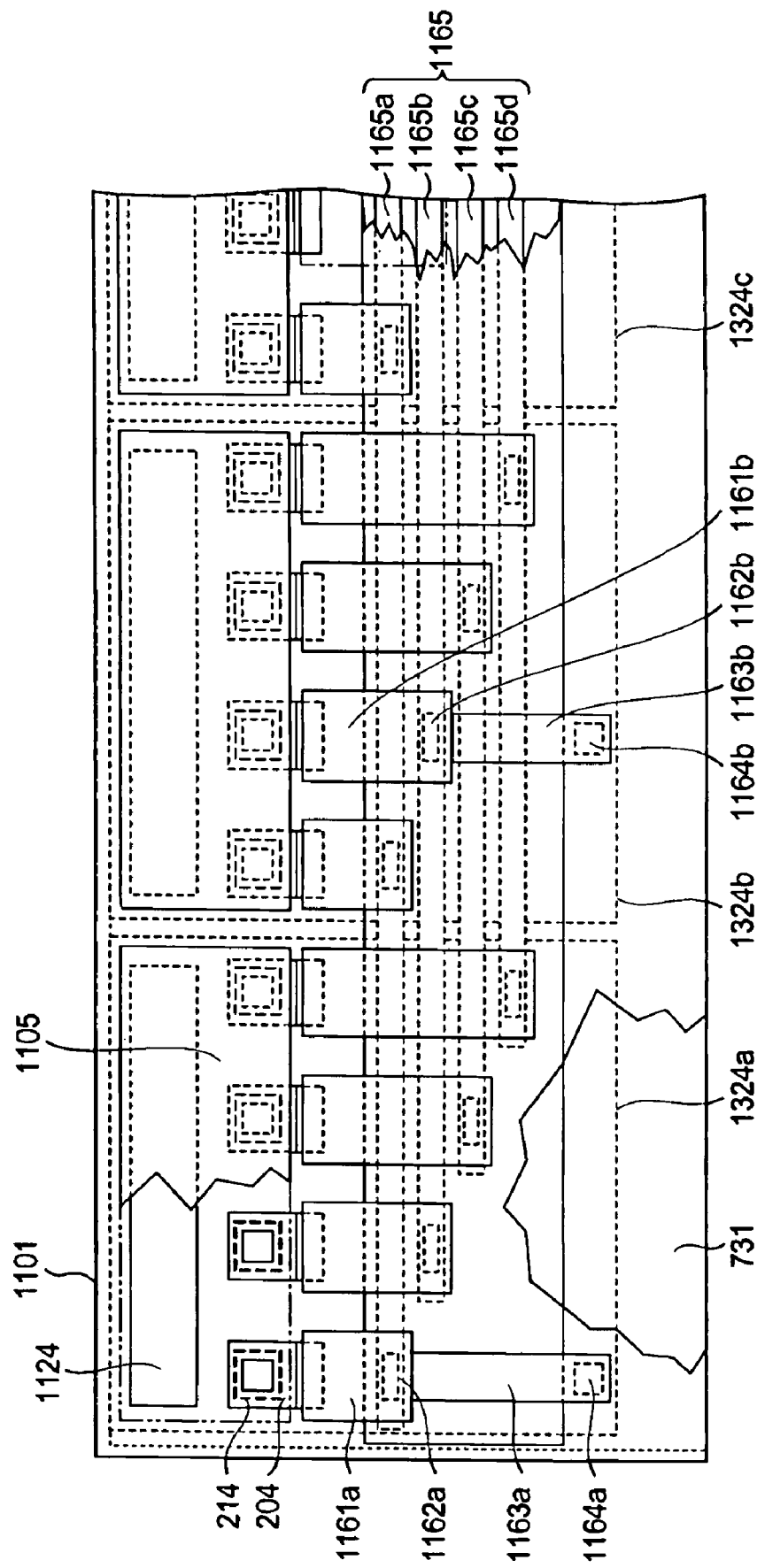
FIG. 15 is a schematic plan view showing a semiconductor device according to a ninth embodiment of the present invention.

A ninth embodiment of the present invention will be explained next. FIG. 15 is a schematic plan view showing a semiconductor device according to the ninth embodiment of the present invention. Different from the fourth to sixth embodiments, a plurality of the LEDs is provided in the LED in the p-type block. Further, a common wiring of each contact is provided on the upper face of the substrate for connecting the n-type area in each block at a same potential.

As shown in FIG. 15, connection areas 1124, p-type connection wiring layers 1324, common wiring patterns 1165, connection areas 1162, connection wiring patterns 1163, and connection areas 1164 are provided on the substrate (not shown). The connection areas 1124 connect the p-side block wiring patterns and the p-type contacts; the p-type connection wiring layers 1324 are divided with respect to each p-type block and are connected to the drive integrated circuit disposed in the lower portion of the semiconductor layers 104; the common wiring patterns 1165 connect n-side contact wiring patterns 1161; the connection areas 1162 connect the n-side contact wiring patterns 1161 and the common wiring patterns 1165; the connection wiring patterns 1163 connect with the drive integrated circuit area 731; and the connection areas 1164 connect with the drive integrated circuit.

In the ninth embodiment, the configurations and materials in the previous embodiments may be used to form the semiconductor layer, the p-side electrode contact layer, the n-side electrode contact layer, the interlayer insulation layer, the conducting layer, the insulation layer, and the like.

According to the ninth embodiment of the present invention, the number of the LEDs included in the p-side block is increased and the LEDs are grouped in order to connect the n-side wiring patterns through a plurality of the common wirings. Further, the connection wiring layers are separated and provided on the lower portion of the semiconductor thin layer with respect to each p-side block. Accordingly, in addition to the effects of the fourth and the sixth embodiments, there is an advantage that a structure of the wiring layer and the wiring patterns are easier to simplify, thereby improving reliability of the wiring structure and reducing a variance in a low wiring resistance.

Figure 16:
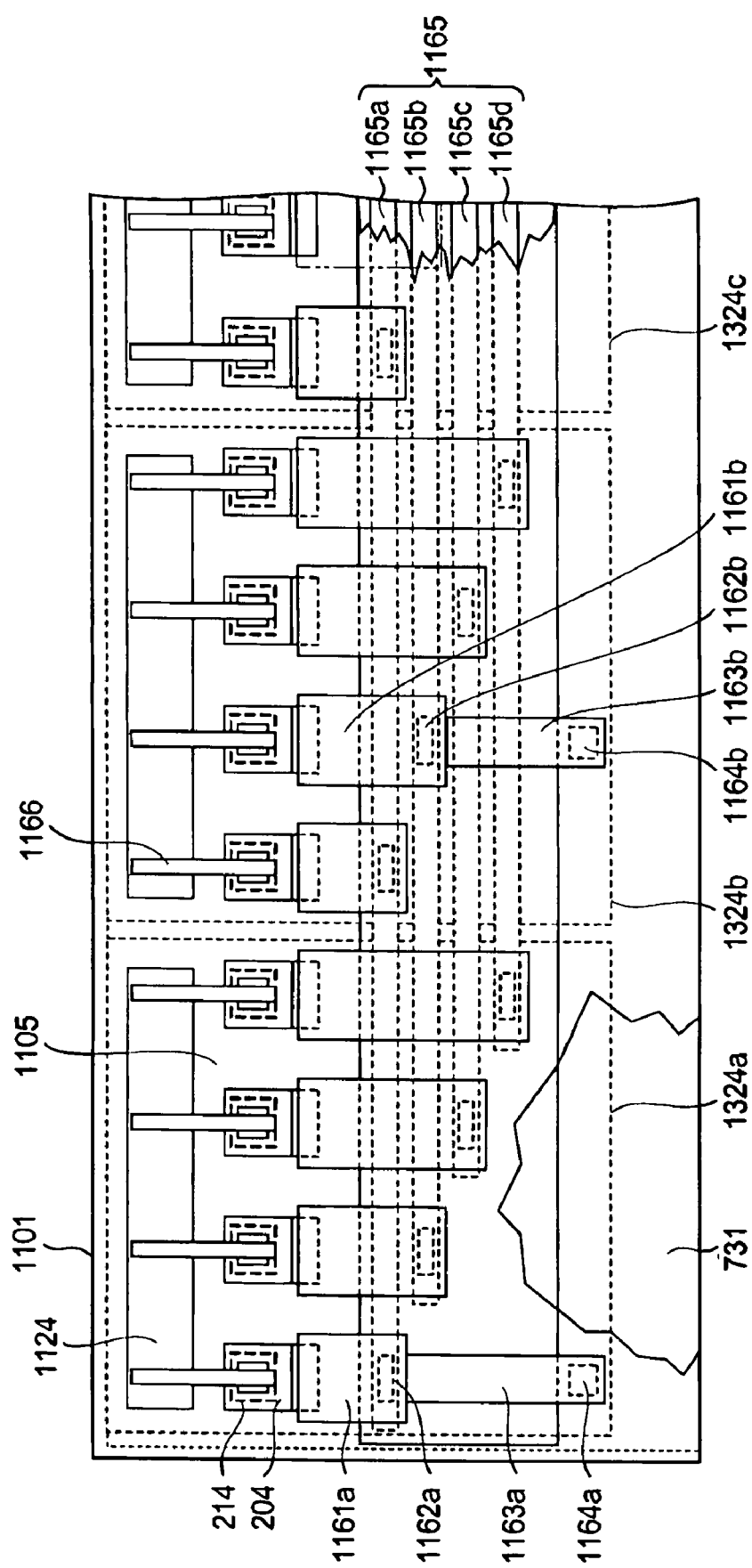
FIG. 16 is a schematic plan view showing a modified example of the semiconductor device according to the ninth embodiment of the present invention.

FIG. 16 is a schematic plan view showing a modified example of the semiconductor device according to the ninth embodiment of the present invention. In the semiconductor device shown in FIG. 16, the contact layers 1166 is formed of a metal member instead of the transparent electrode.

Figure 17:
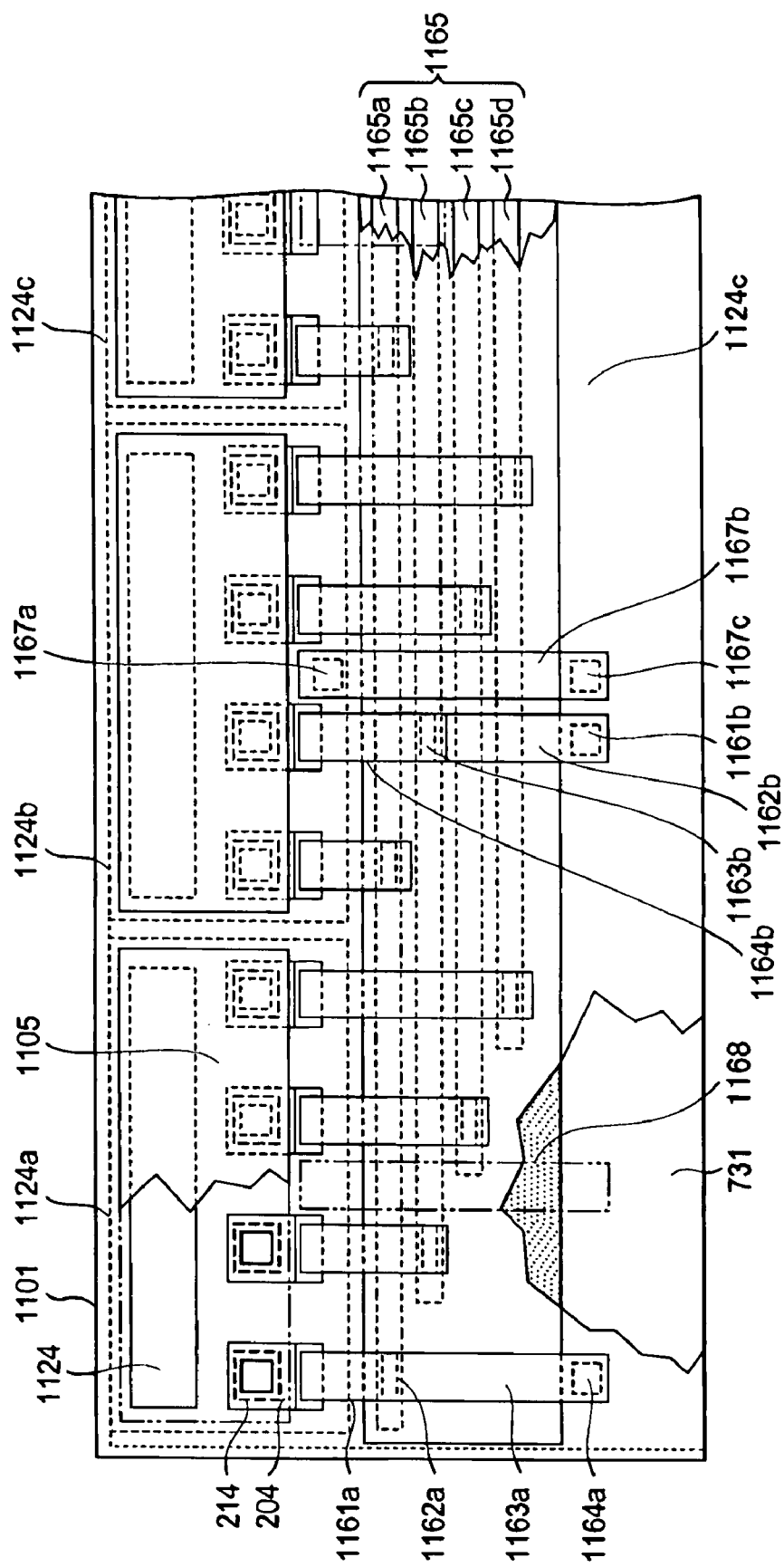
FIG. 17 is a schematic plan view showing another modified example of the semiconductor device according to the ninth embodiment of the present invention.

FIG. 17 is a schematic plan view showing another modified example of the semiconductor device according to the ninth embodiment of the present invention. As shown in FIG. 17, wiring patterns (1168 or 1167*b*) are provided in the upper portion for connecting between each of the p-side blocks and the drive circuit. The wiring patterns 1161 to 1164 have a narrow width, thereby reducing a defect caused by a mask deviation or the like.

Figure 18:
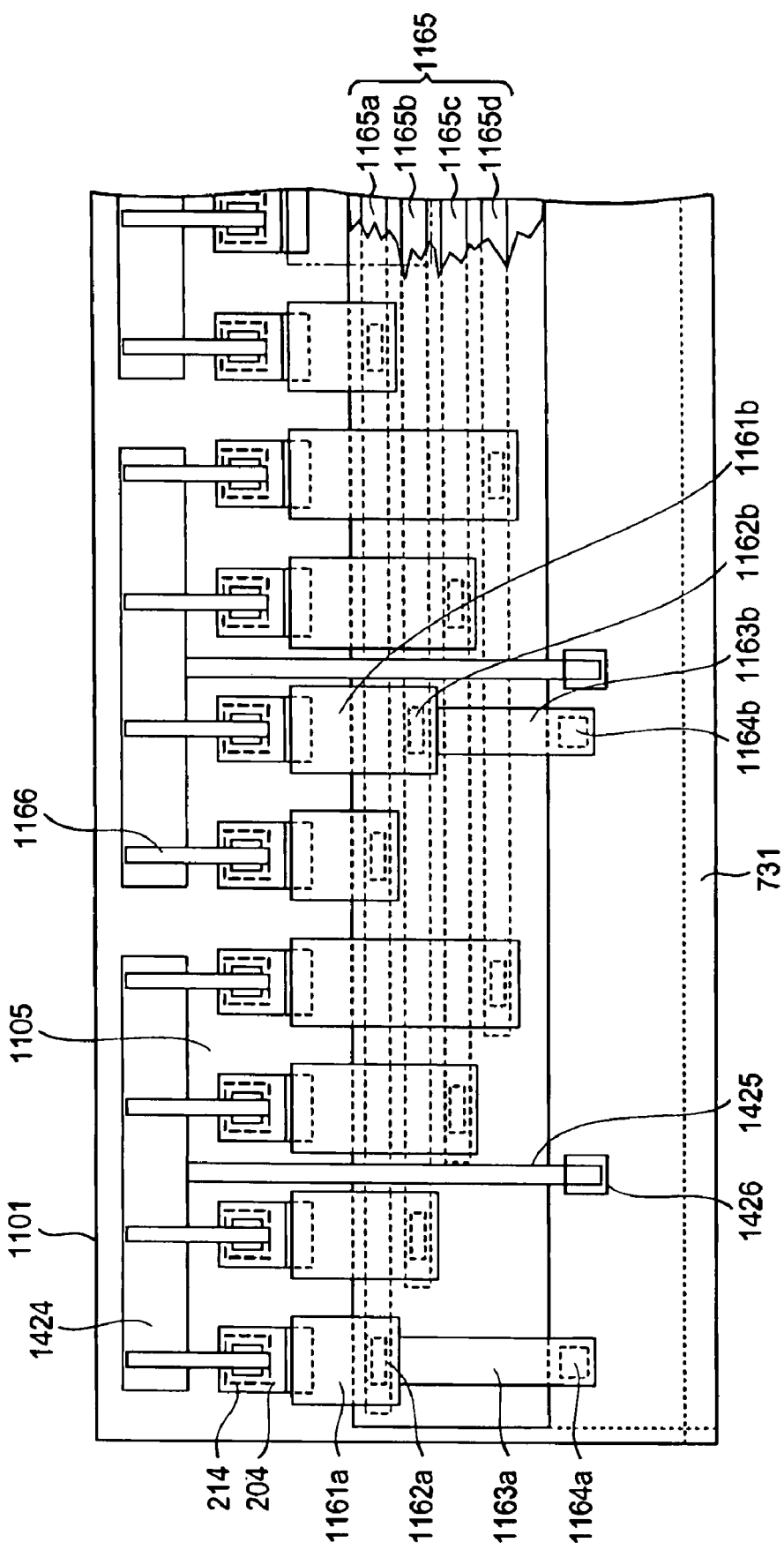
FIG. 18 is a schematic plan view showing a further modified example of the semiconductor device according to the ninth embodiment of the present invention.

FIG. 18 is a schematic plan view showing a further modified example of the semiconductor device according to the ninth embodiment of the present invention. As shown in FIG. 18, wiring patterns 1425 and 1426 are provided instead of the p-side wiring layers described above.

As other modified examples, a size of the connection areas 1164 or 1426 may be increased, so that a probe needle of a standard probe card can contact, or may be decreased, so that only a connection function is provided. Further, the common wiring layers 1165 and the n-side wiring patterns 1161 to 1163 may be disposed in a different order. The areas for providing the semiconductor layers may be adjustable, so that the semiconductor layers are provided on the integrated circuit area or other areas.

Figure 19:
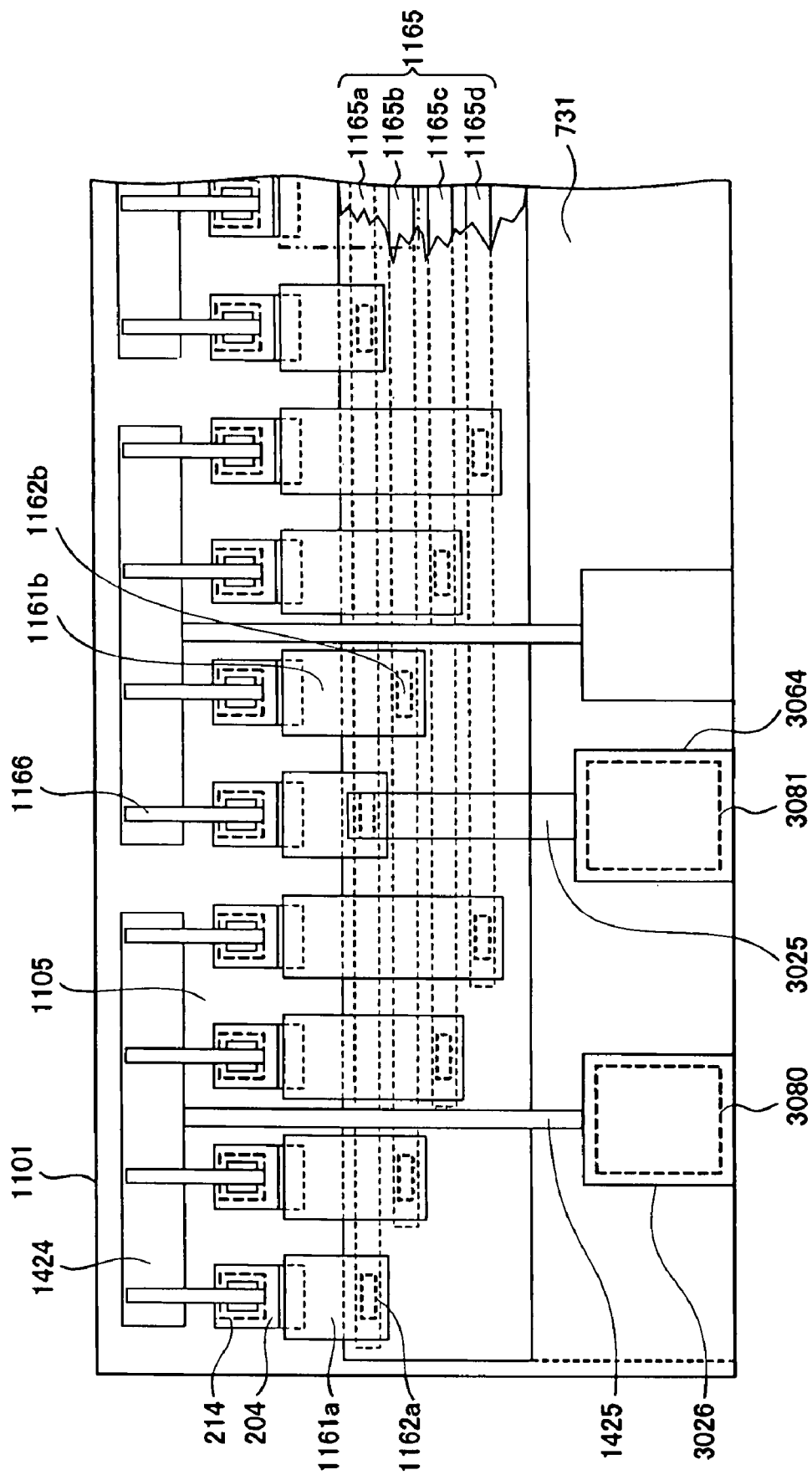
FIG. 19 is a schematic plan view showing a still further modified example of the semiconductor device according to the ninth embodiment of the present invention.
Figure 20:
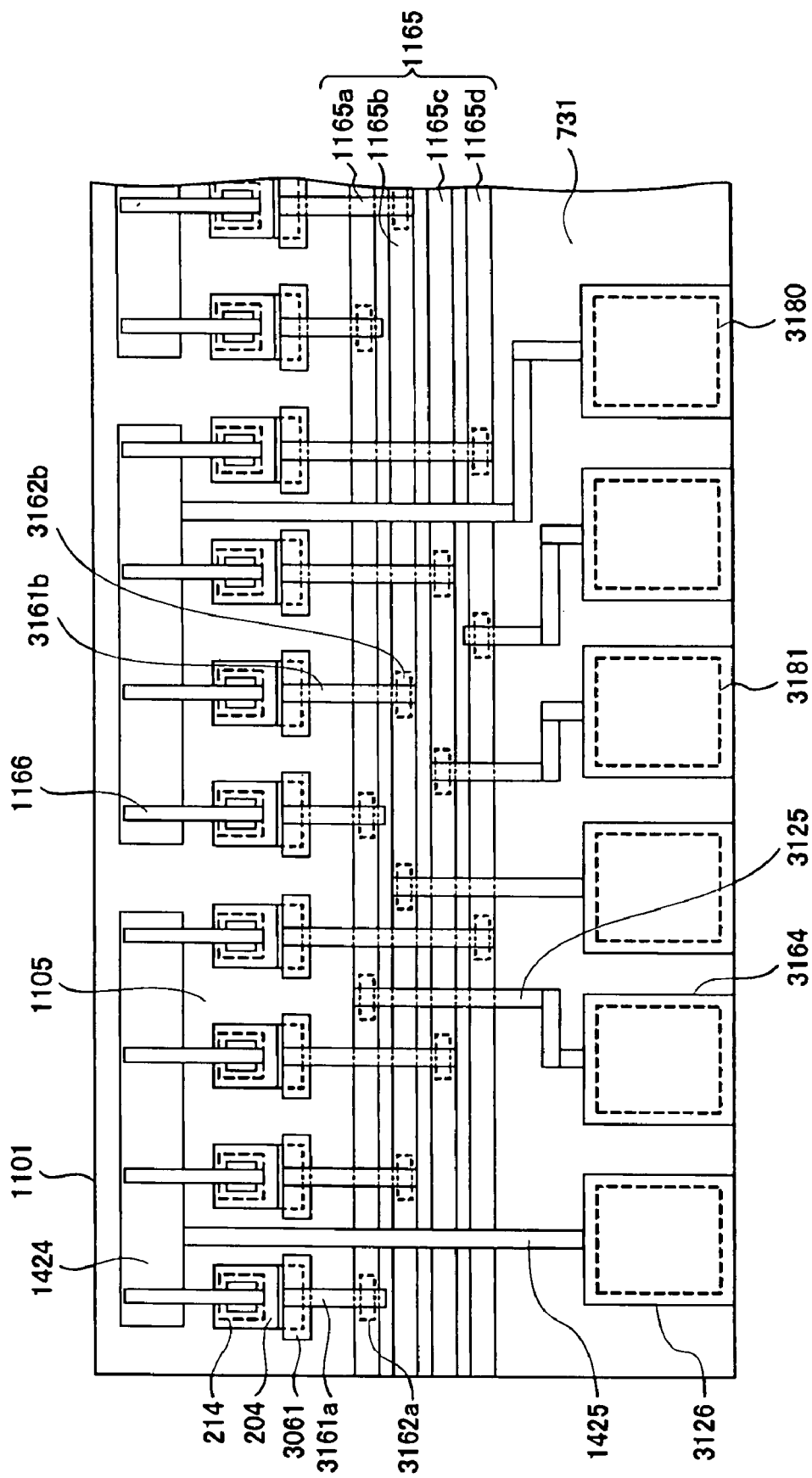
FIG. 20 is a schematic plan view showing a still further modified example of the semiconductor device according to the ninth embodiment of the present invention.
Figure 21:
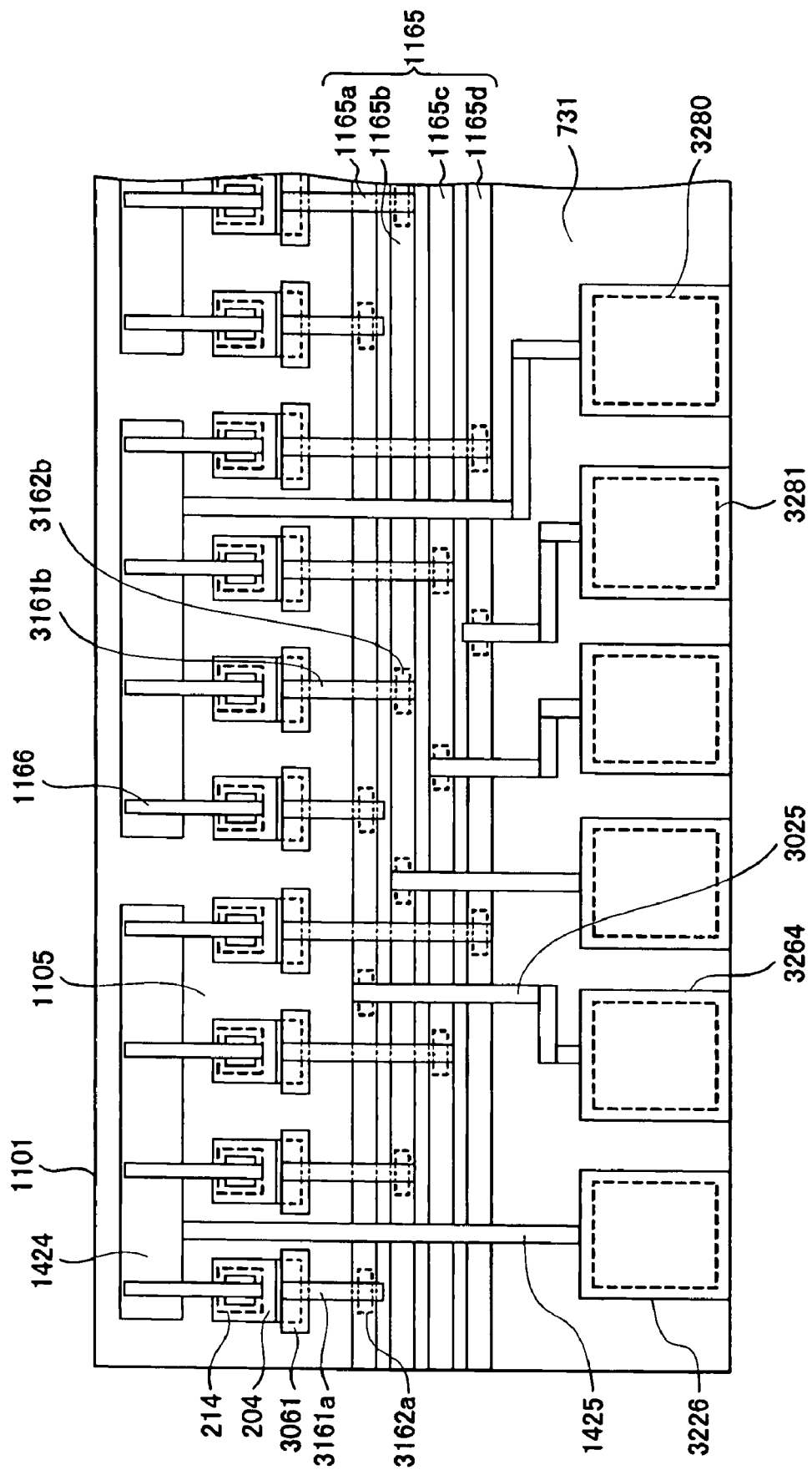
FIG. 21 is a schematic plan view showing a still further modified example of the semiconductor device according to the ninth embodiment of the present invention.
Figure 22:
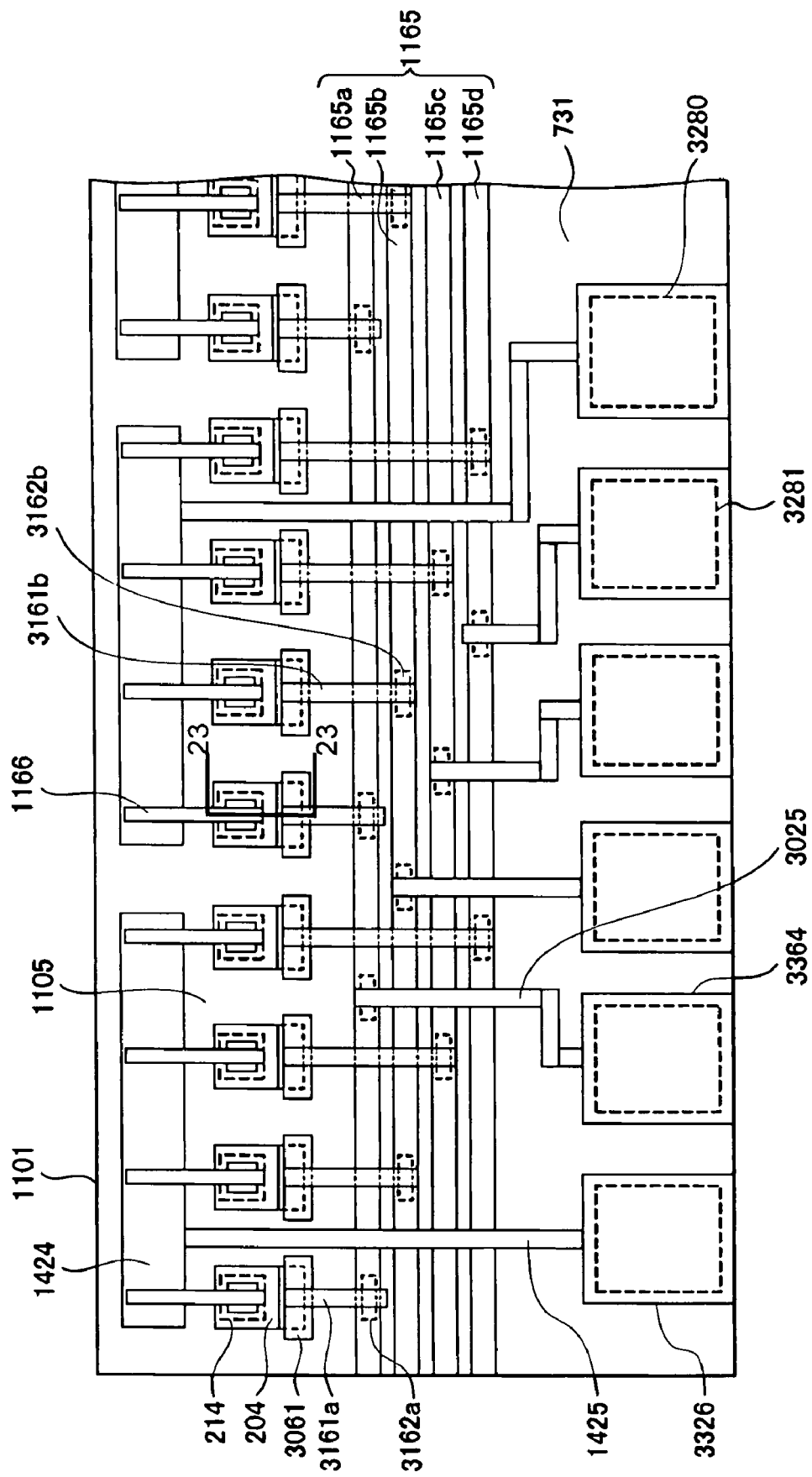
FIG. 22 is a schematic plan view showing a still further modified example of the semiconductor device according to the ninth embodiment of the present invention.
Figure 23:
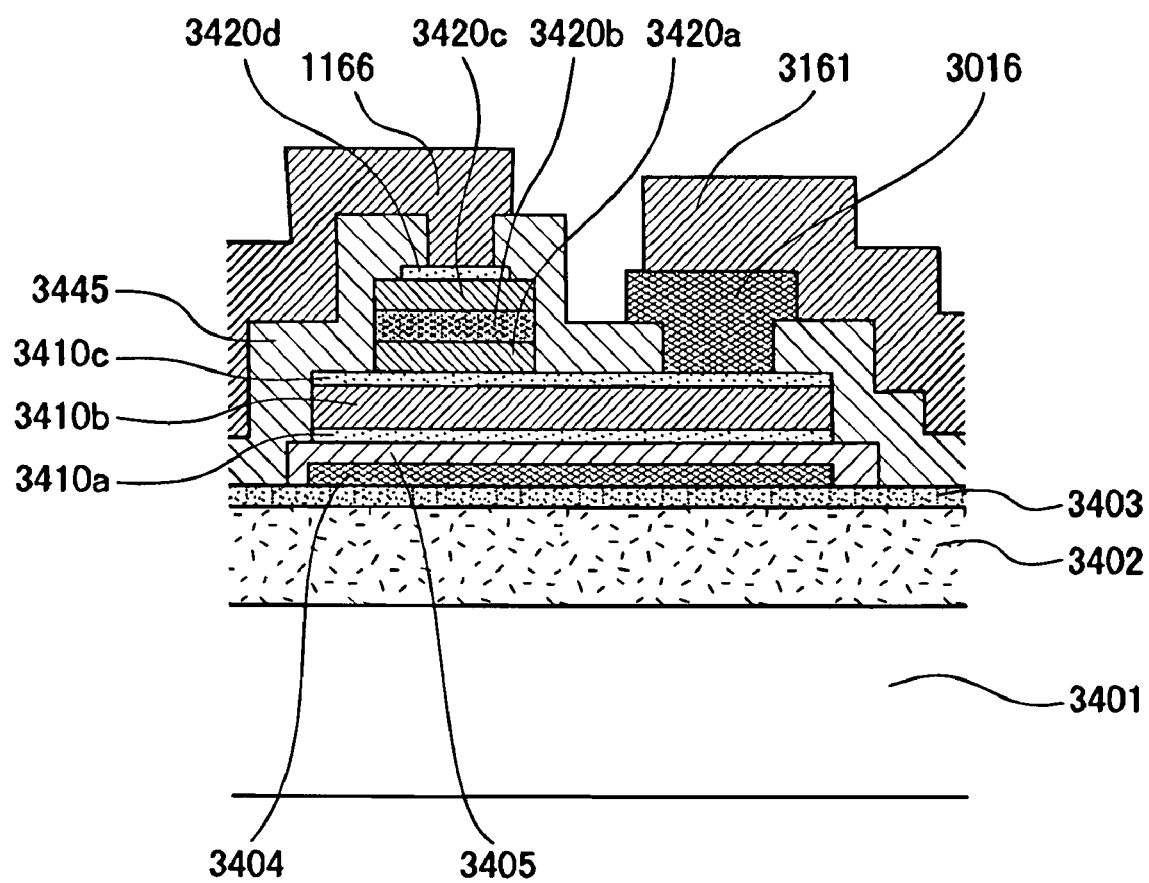
FIG. 23 is a sectional view showing a still further modified example of the semiconductor device taken along a line 23-23 in FIG. 22.

FIG. 19 is a schematic plan view showing a still further modified example of the semiconductor device according to the ninth embodiment of the present invention. FIG. 20 is a schematic plan view showing a still further modified example of the semiconductor device according to the ninth embodiment of the present invention. FIG. 21 is a schematic plan view showing a still further modified example of the semiconductor device according to the ninth embodiment of the present invention. FIG. 22 is a schematic plan view showing a still further modified example of the semiconductor device according to the ninth embodiment of the present invention. FIG. 23 is a sectional view showing a still further modified example of the semiconductor device taken along a line 23-23 in FIG. 22.

As shown in FIG. 19, a connection area 3026 is provided for connecting the p-side wiring pattern and the drive circuit. The connection area 3026 may be formed of, for example, a material same as that of the wiring patterns 1424 and 1425 and the p-side contacts 1166. The material may includes, for example, an Au type material such as Ti/Pt/Au, AuZIl, and Ni/Au, and an Al type material such as Al, Ni/Al, Cr/Al, Ti/Al, and AlSiCu.

In the specification, the "Al type material" refers to a material containing Al as an alloy, a mixed compound, or a layer of a layered structure. Further, a material including Au or Ag instead of Al is referred to as the Au type material or an Ag type material, respectively.

A connection area 3064 is a connection area of an n-side wiring pattern 3025 and the drive circuit. The connection areas 3064 and 3025 may be formed of a material same as that of the connection area 3026. Connection pads 3080 and 3081 are formed when the drive circuit is formed. The connection pads 3080 and 3081 formed of, for example, AlSiCu are indicated by hidden lines in the connection areas 3026 and 3064 in FIG. 22.

As shown in FIG. 20, the connection areas 3126 are provided for connecting the p-side wiring patterns and the drive circuit, and the connection areas 3164 are provided for connecting the n-side wiring patterns and the drive circuit. Wiring pattern 3125 are connected in areas outside connection area 3162 on the common wiring layers 1165. N-side contacts 3061 are, for example, formed of AuGeNi/Au. Wiring patterns 3161 are, for example, formed of Ti/Pt/Au. All of the layers (contacts or wiring patterns) 1161, 1424, 1425, 3161, 3126, and 3164 may be formed of the same material, i.e., Ti/Pt/Au.

Similar to the semiconductor device shown in FIG. 19, connection pads 3180 and 3181 indicated by hidden lines in FIG. 20 are formed when the drive circuit is formed, and may be formed of, for instance, AlSiCu. Further, as shown in FIG. 20, the drive integrated circuit area 731 may reach the lower portion of the common wiring layers 1165 or near a chip edge portion area on a side of the wiring patterns 1424 (not shown).

In the semiconductor device shown in FIG. 20, a group of four n-side connection areas are disposed with respect to four common wiring patterns, and a plurality of the connection areas may be provided in the chip. Further, the n-side connection areas may not be connected to the integrated circuit, and may be connected to an external circuit through a wire bonding, so that the n-side potential (i.e ground potential) is supplied and controlled. When the potential is supplied externally, the connection pad 3181 may be omitted as the drive circuit is formed.

FIG. 21 is a modified example of the connection areas 3226 and 3264 formed of different materials. For example, the connection area 3226, the wiring patterns 1425 and 1424 connected thereto, the p-side contact 1166, and the n-side wiring patterns 3161 may be formed of the Au type material such as Ti/Pt/Au. Further, the wiring pattern 3025 connecting the common wiring patterns and the n-side connection area 3264, and the connection area 3264 may be formed of the Al type material such as Al, Ni/Al, Cr/Al, Ti/Al, or AlSiCu. When connecting to an external circuit through the wire bonding so that the n-side potential is supplied externally, the pad 3281 may be omitted In the n-side connection area 3264.

Further, when a pad for input connection (not shown in FIG. 21) is provided in order to supply a power source or a control signal to the drive circuit externally, the Al type material such as AlSiCu and the like, may be exposed to form the pad. Alternatively, the material of the connection pad 3264 described above such as Al, Ni/Al, Cr/Al, Ti/Al, AlSiCu, and the like, may coat all or a part of the connection area to form the pad.

The connection area may have a size large enough to use the probe needle of the probe card to check an operation of each chip in the wafer status using a probe/tester, or may have a size large enough so that a probe needle does not exceed the connection area and destroy the integrated circuit. Further, the connection area may have a size for connecting to the external circuit through the wire bonding. For example, the rectangular connection area may have a side equal to or greater than 30 μm. More specifically, the rectangular area is preferred to have a side equal to or greater than 60 μm.

As compared with the modified example shown in FIG. 21, in the modified example show in FIG. 22, the drive circuit area is extended in the area direction where the semiconductor thin layer is provided. In this way, the drive circuit area may be formed below the semiconductor thin layer.

FIG. 23 is a sectional view showing a still further modified example of the semiconductor device taken along a line 23-23 in FIG. 22. In the previous examples, the p-type impurity is diffused to the n-type semiconductor layer. As shown in FIG. 23, the p-type and n-type semiconductor layers may be provided in advance. The light emitting element in the semiconductor thin layer (materials to form the semiconductor thin layer) is formed of an AlGaAs type compound semiconductor material, and may be formed of other semiconductor members including a nitride compound semiconductor such as InP, GaAsP, GaInAsP, AlGaAsP, GaN, AlGaN, InGaN, and the likes.

As shown in FIG. 23, inside and on a silicon substrate 3401, there are provided an integrated circuit area 3402; an interlayer insulation layer 3403 at a top layer of the integrated circuit area (integrated circuit wafer); and a reflection layer 3404 for reflecting light emitting to the backside of the wafer from the light emitting area toward the upper surface of the wafer. The reflection layer 3403 may be formed of the Au/Al/Ag type metal including Ti, Ti/Pt/Au, TiAl, Cr/Au, Cr/Au, Ni/Al, Ag and Ag type alloy.

Further, an insulation layer 3405, epitaxial semiconductor layers 3410a to 3410c and 3420a to 3420d are provided. The epitaxial semiconductor layers constitute the light emitting element or the semiconductor thin layer. For example, the epitaxial semiconductor layer 3410a is formed of n-GaAs; the epitaxial semiconductor layer 3410b is formed of n-Al$_{1-x}$Ga$_{1-x}$As; the epitaxial semiconductor layer 3410c is formed of n-GaAs; the epitaxial semiconductor layer 3420a is formed of n-Al$_z$Ga$_{1-z}$As; the epitaxial semiconductor layer 3420b is formed of n-Al$_y$Ga$_{1-y}$As; the epitaxial semiconductor layer 3420c is formed of p-Al$_x$Ga$_{1-x}$As; and the epitaxial semiconductor layer 3420d is formed of p-GaAs.

In the embodiment, the epitaxial semiconductor layers 3420a and 3420c are clad layers; the epitaxial semiconductor layer 3420b is an active layer; and the epitaxial semiconductor layers 3410c and 3420d are n-side and p-side contact layers, respectively. A first conductive side electrode 3016 is formed of a material to form an ohmic contact with a GaAs layer, i.e. AuGe/Ni/Au. A second conductive side electrode 1166 is formed of a material to form an ohmic contact with a GaAs, i.e., Ti/Pt/Au. A first conductive side wiring pattern 3161 may be formed of Ti/Pt/Au.

Tenth Embodiment

Figure 24:
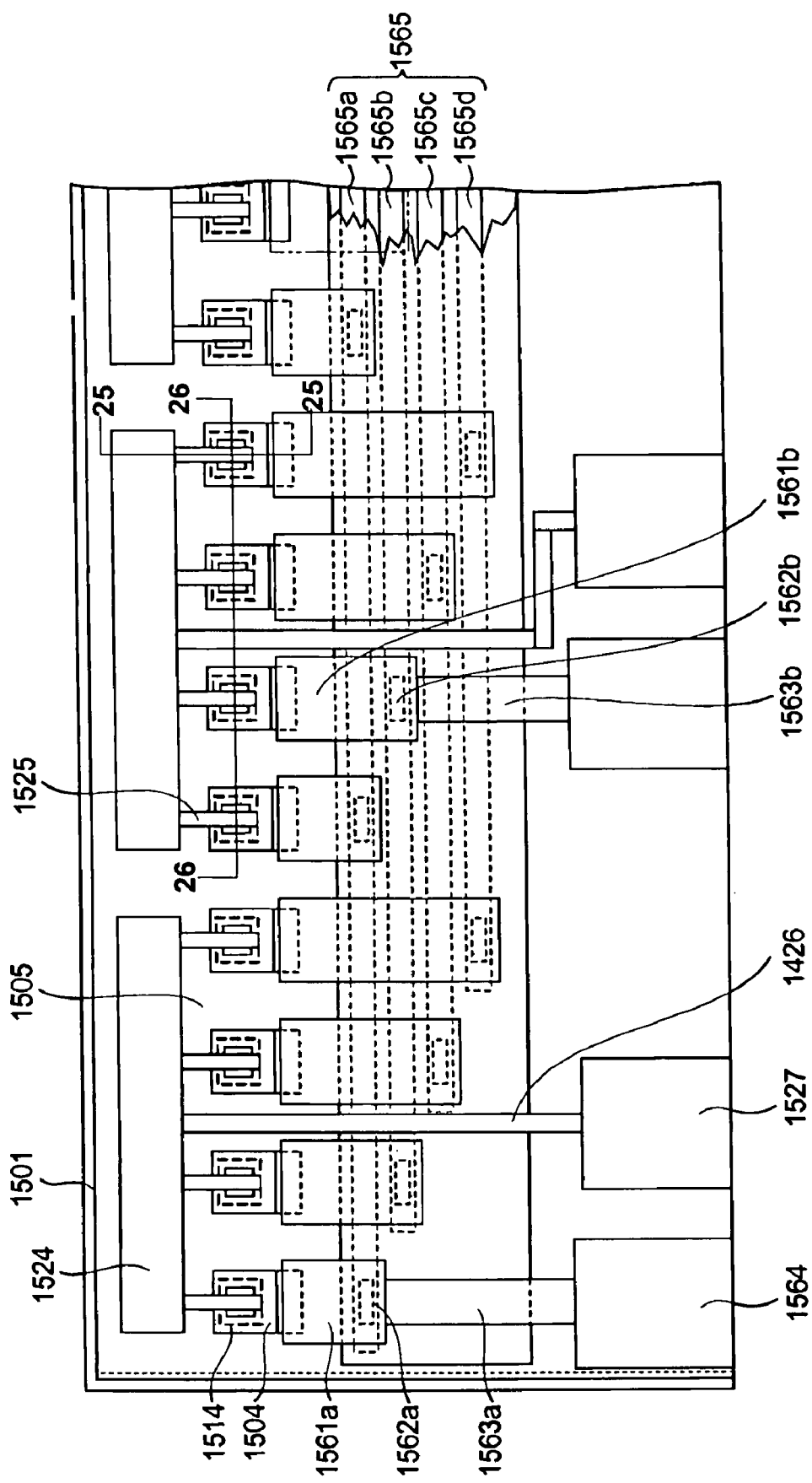
FIG. 24 is a schematic plan view showing a semiconductor device according to a tenth embodiment of the present invention.
Figure 25:
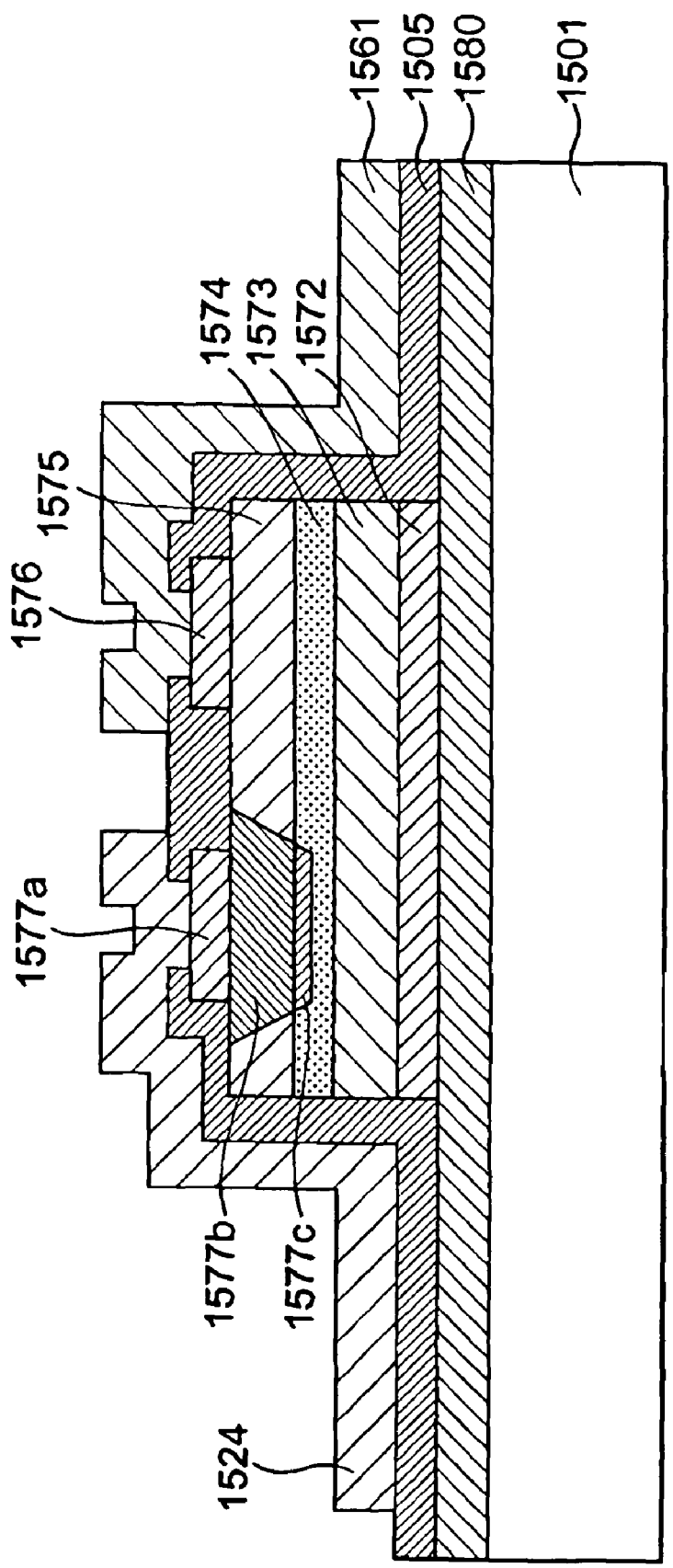
FIG. 25 is a schematic sectional view of the semiconductor device taken along a line 25-25 in FIG. 24 according to the tenth embodiment of the present invention.
Figure 26:
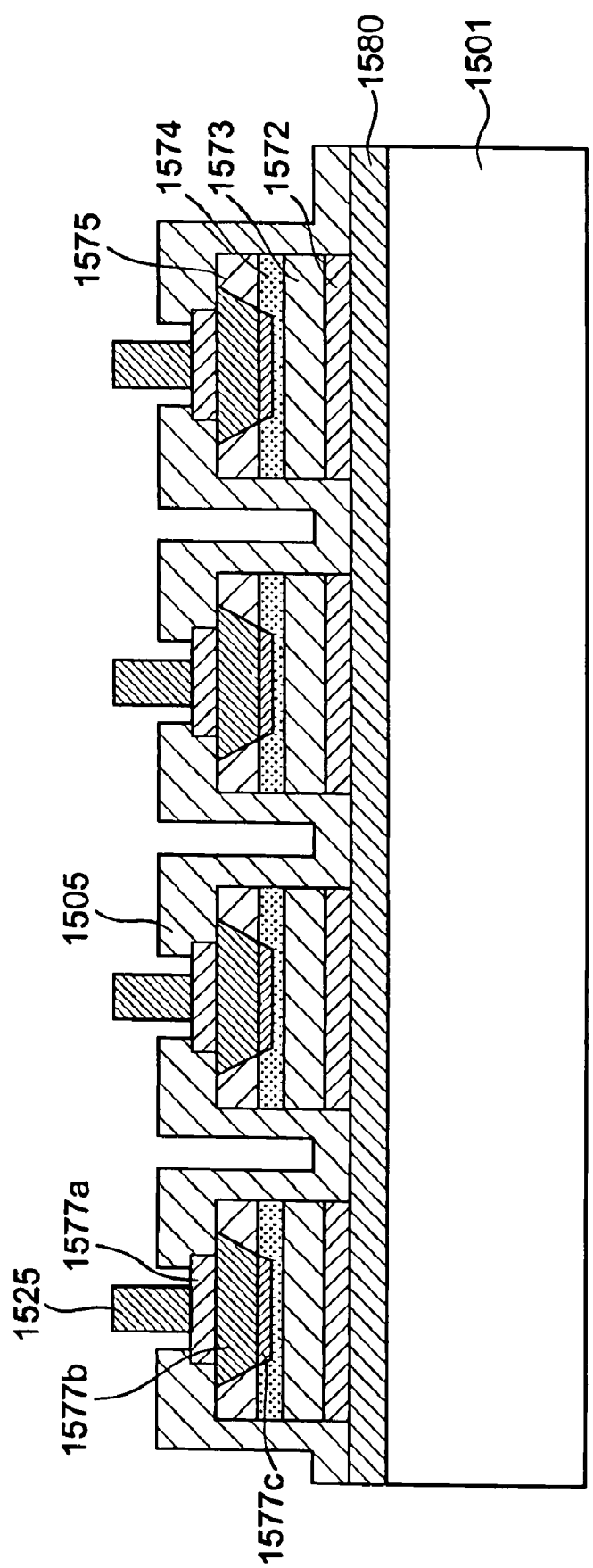
FIG. 26 is a schematic sectional view of the semiconductor device taken along a line 26-26 in FIG. 24 according to the tenth embodiment of the present invention.

A tenth embodiment of the present invention will be explained next. FIG. 24 is a schematic plan view showing a semiconductor device according to the tenth embodiment of the present invention. FIG. 25 is a schematic sectional view of the semiconductor device taken along a line 25-25 in FIG. 24 according to the tenth embodiment of the present invention. FIG. 26 is a schematic sectional view of the semiconductor device taken along a line 26-26 in FIG. 24 according to the tenth embodiment of the present invention.

In the first to ninth embodiments, the semiconductor layer is formed on the different substrate. On the other hand, in the tenth embodiment, a GaAs substrate 1501 or a compound semiconductor substrate is used as the substrate. The LED formed on the GaAs substrate 1501 is a semiconductor layer that is epitaxially grown from the GaAs substrate 1501.

As shown in FIG. 24, the LED elements are individually formed on the n-type GaAs substrate 1501. Semiconductor layers 1504 are epitaxially grown and formed on the GaAs substrate 1501. Similar to the semiconductor device shown in FIG. 19, each of the LEDs is disposed in an individual LED area. The semiconductor layer 1504 is formed of, for example, an n-type GaAs layer 1572; an n-type Al$_x$Ga$_{1-x}$As clad layer 1573; an n-type Al$_y$Ga$_{1-y}$As active layer 1574; n-type Al$_z$Ga$_{1-z}$As clad layer 1575; and an n-type GaAs contact layer 1576.

In the embodiment, a p-type impurity such as Zn is selectively diffused in the n-type semiconductor thin layer 104 to form a p-type semiconductor thin layer 1577. The p-type semiconductor thin layer 1577 includes a p-type GaAs layer 1577a; a p-type Al$_z$Ga$_{1-z}$As clad layer 1577b; and a p-type Al$_y$Ga$_{1-y}$As active layer 1577c, in which x, y, and z, are within ranges of 0<x<1, 0<y<1, and 0<z<1, respectively.

In the embodiment, a p-side connection pad 1527 and an n-side connection pad 1564 are provided on the substrate outside the areas of the light emitting elements, and function as pads for connecting to outside through a wire bonding. A p-type GaAs layer 1580 having a conductive type opposite to that of the n-type GaAs substrate 1501 is formed and functions as an insulation layer. Each of the semiconductor layers 1504 is electrically separated.

According to the tenth embodiment of the present invention, the substrate is formed of the compound semiconductor substrate or the GaAs substrate. The light emitting elements formed on the GaAs substrate are provided in the semiconductor layers epitaxially grown from the GaAs substrate. Further, each of the LED areas is separately provided, thereby making it easy to produce the semiconductor device as opposed to the case of using the semiconductor thin layer.

As far as the substrate meets desired requirements, the substrate 1501 may be formed of a p-type GaAs substrate. Further, without dividing into a plurality of the p-type blocks, all of the p-type areas may be connected to be in a same potential.

Eleventh Embodiment

Figure 27:
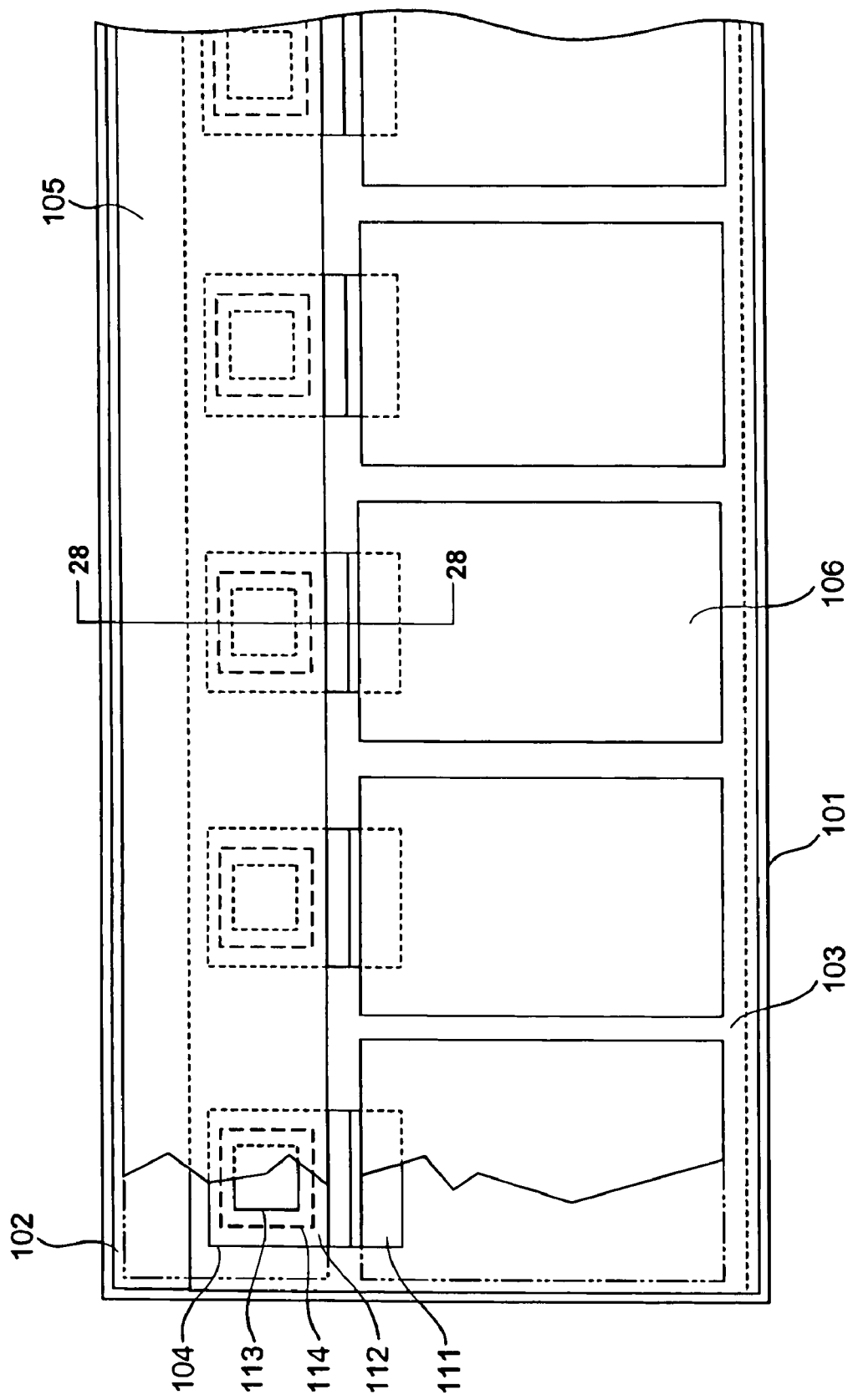
FIG. 27 is a schematic plan view showing a semiconductor device according to an eleventh embodiment of the present invention.
Figure 28:
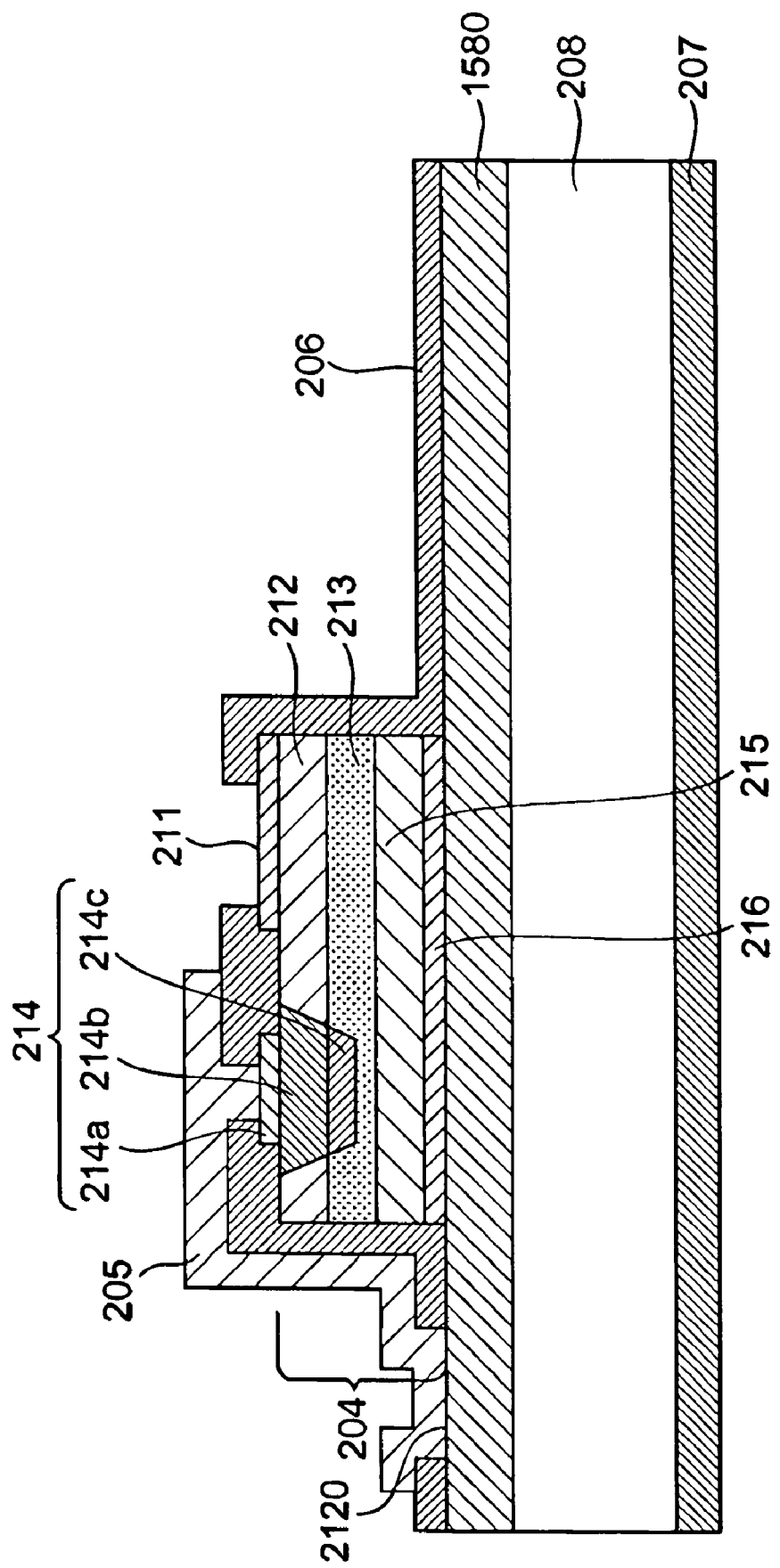
FIG. 28 is a schematic sectional view of the semiconductor device taken along a line 28-28 in FIG. 27 according to the eleventh embodiment of the present invention.

An eleventh embodiment of the present invention will be explained next. FIG. 27 is a schematic plan view showing a semiconductor device according to the eleventh embodiment of the present invention. FIG. 28 is a schematic sectional view of the semiconductor device taken along a line 28-28 in FIG. 27 according to the eleventh embodiment of the present invention.

Different from the tenth embodiment, in the eleventh embodiment, a common electrode 207 is provided on a backside of a p-type GaAs substrate 208. As shown in FIG. 28, a semiconductor layer 204 is formed on the p-type GaAs substrate 208 with the p-type GaAs layer 1580 inbetween. The p-type common electrode 207 is disposed on the backside of the substrate 208. The transparent electrode 205 provided on a p-type contact layer 214a of the semiconductor layer 204 is connected to the p-type GaAs layer 1580 through a contact area 2120.

In the embodiment, the p-type common electrode 207 on the backside of the substrate 208 may be formed of, for example, a metal material such as AuZn, TiPtAu, Al, Ni/Al, Ti/Al, and the likes. The semiconductor 204 may be formed of a material same as that in the previous embodiments. A contact in a p-type GaAs layer 2120 may be substituted with a metal wiring pattern. Further, all of the p-side wiring patterns may be formed of metal members.

In the embodiment, a sufficient p-side common potential is supplied through the electrode 207 provided on the backside of the substrate 208. The LEDs are controlled through switching ON/OFF of the potential of the n-side contacts provided on the upper face of the substrate. All of the p-type areas divided individually are connected to the p-type GaAs layer 1580 provided on the substrate. The potential is supplied through the p-type common electrode 207 provided on the backside of the substrate via the p-type GaAs substrate. Accordingly, in addition to the effects of the previous embodiments, there is such an advantage that the wiring patterns and the pads may be provided less crowdedly.

Twelfth Embodiment

In a twelfth embodiment of the present invention, an LED printer head as an example of the semiconductor device described above will be explained next with reference to FIG.

Figure 29:
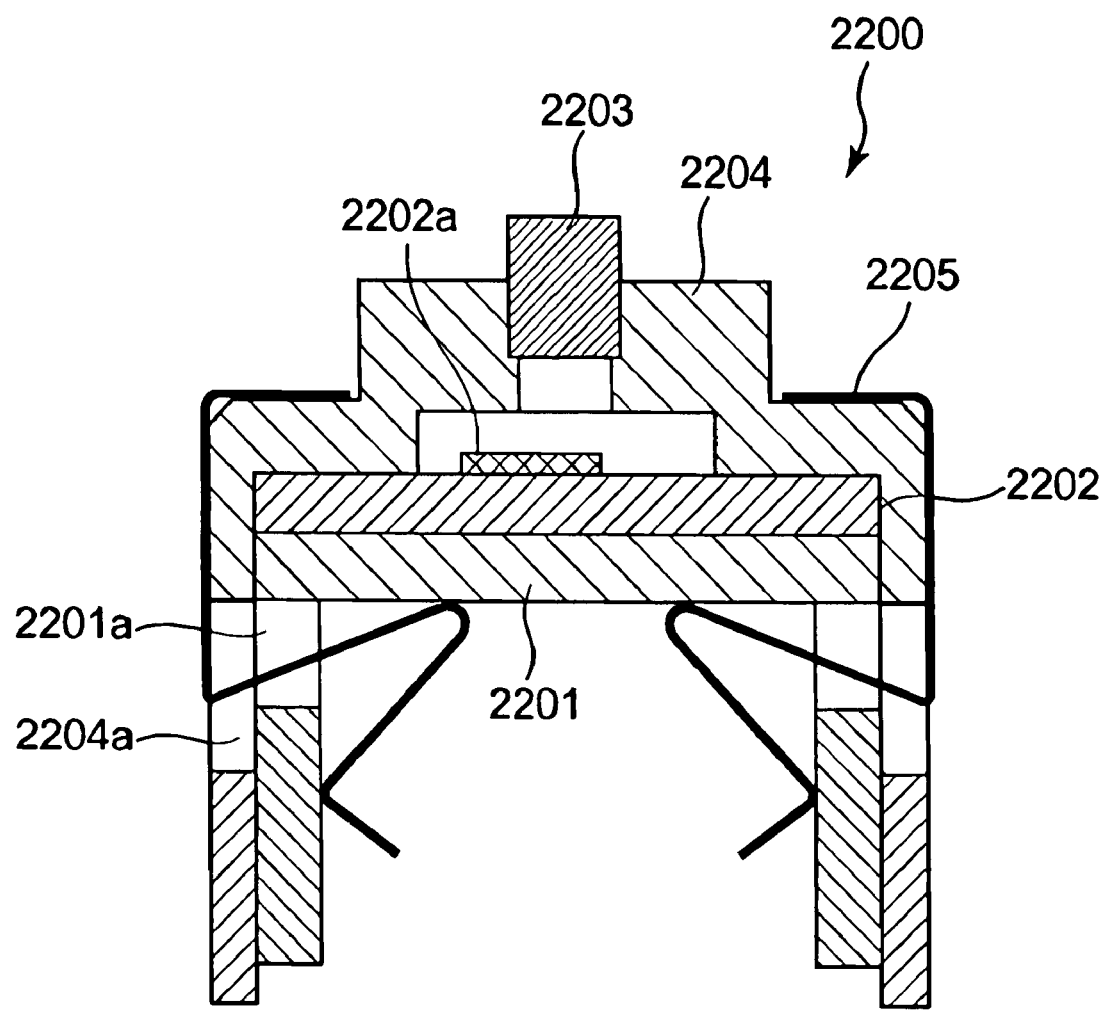
FIG. 29 is a schematic sectional view showing an LED printer head according to a twelfth embodiment of the present invention.
Figure 30:
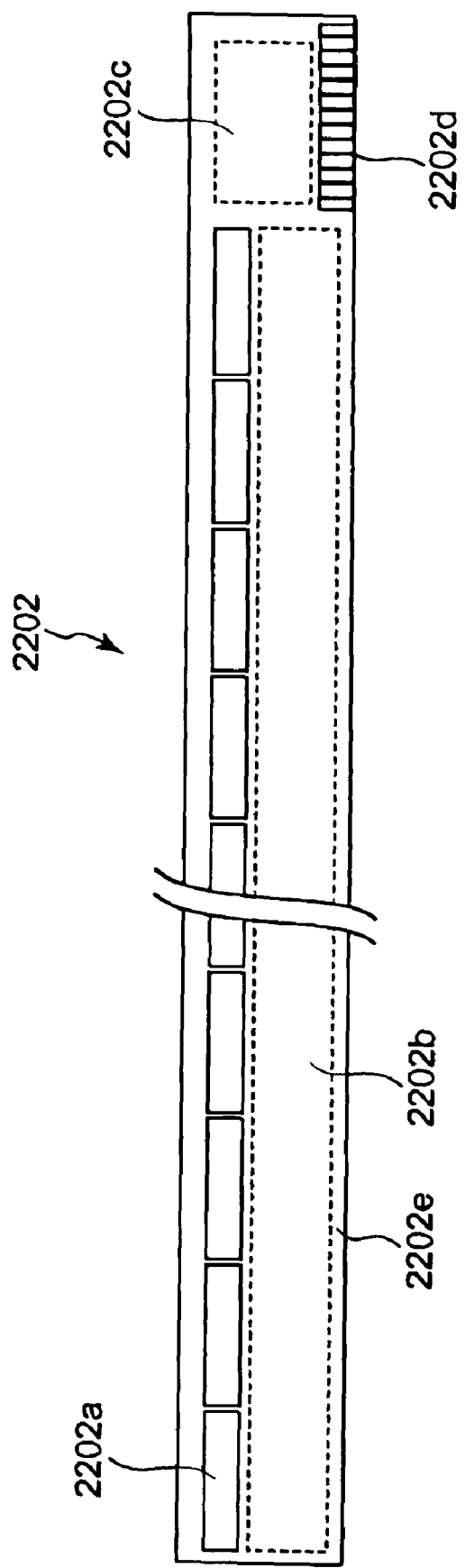
FIG. 30 is a plan view showing an LED unit according to the twelfth embodiment of the present invention.

29. FIG. 29 is a schematic sectional view showing an LED printer head 2200 based on the LED head according to the twelfth embodiment of the present invention. FIG. 30 is a plan view showing an LED unit 2202 according to the twelfth embodiment of the present invention.

As shown in FIG. 29, an LED unit 2202 is provided on a base member 2201. In the LED unit 2202, the semiconductor device described in the above embodiments is provided on a mounting substrate.

As shown in FIG. 30, on a mounting substrate 2202e, a plurality of the semiconductor devices in the previous embodiments is arranged as light emitting portion units 2202a in a longitudinal direction thereof. An electrical component mounting areas 2202b and 2202c having electrical components and wiring patterns, a connector 2202d to supply a control signal and a power source externally, and the likes are provided on the mounting substrate 2202e.

In the embodiment, a rod lens array 2203 is disposed on the light emitting portion of the light emitting unit 2202a as an optical element for condensing light emitting from the light emitting portion. A plurality of optical lenses with a column shape is arranged linearly along the light emitting portions of the light emitting units 2202a, thereby forming the rod lens array 2203. A lens holder 2204 as an optical element holder holds the rod lens array 2203 at a specific position.

As shown in FIG. 29, the lens holder 2204 covers the base member 2201 and the LED unit 2202. A clamper 2205 is arranged through opening portions 2201a and 2204a formed in the base member 2201 and the lens holder 2204, so that the clamper 2205 integrally holds the base member 2201, the LED unit 2202, and the lens holder 2204. Accordingly, light emitting from the LED unit 2202 irradiates a specific outer member through the rod lens array 2203. The LED printer head 2200 with the configuration described above is used as an exposure device of a photoelectric printer or a photoelectric copier.

As described above, according to the LED head in the embodiments of the present invention, one of the semiconductor devices explained in the embodiments above is used as the LED unit 2202. Accordingly, the energy-efficient LED with the wiring patterns resistant to losses.

Thirteenth Embodiment

Figure 31:
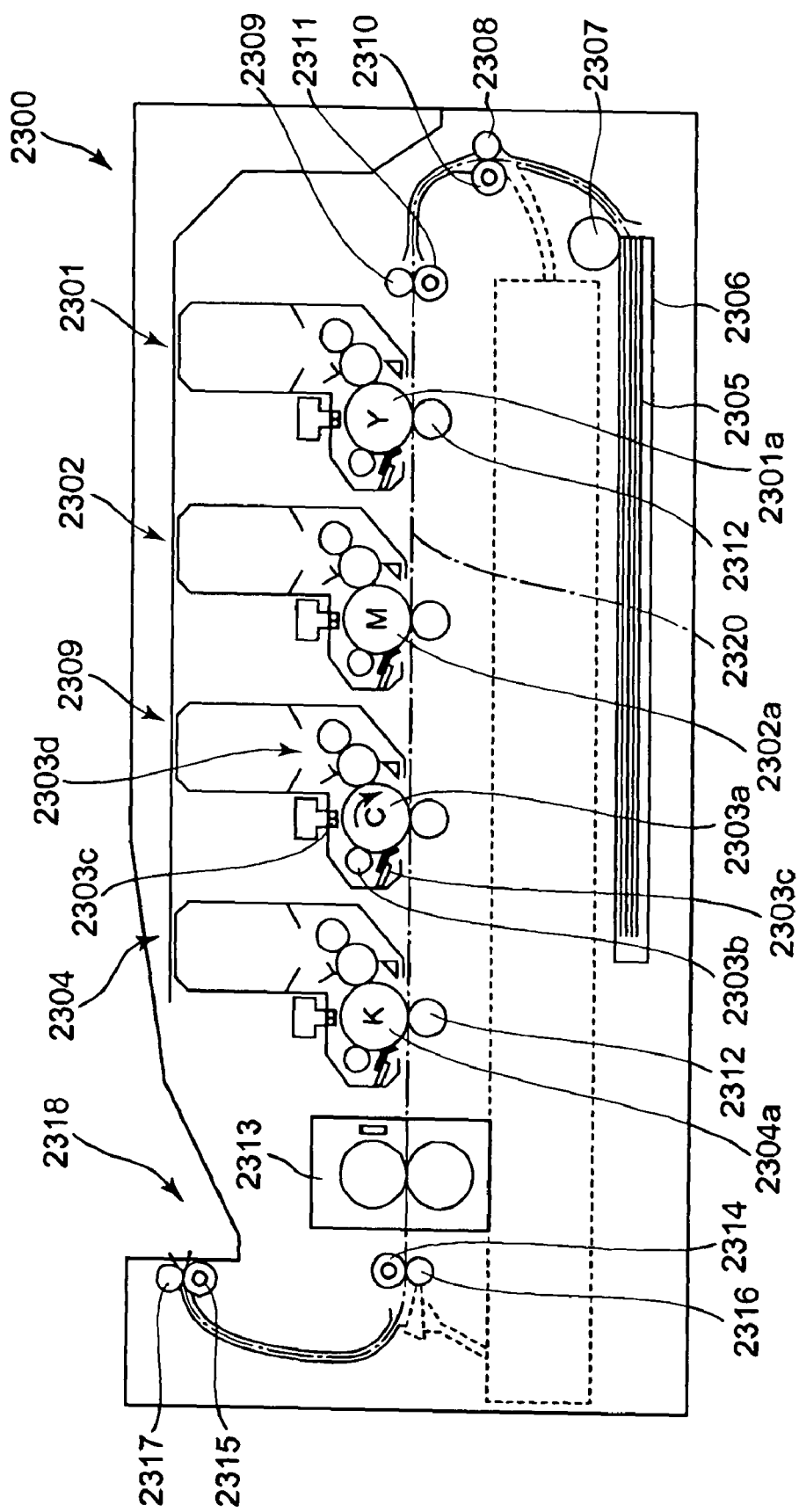
FIG. 31 is a schematic view showing an image forming apparatus according to a thirteenth embodiment of the present invention.

A thirteenth embodiment of the present invention will be explained next. FIG. 31 is a schematic view showing an image forming apparatus 2300 according to the thirteenth embodiment of the present invention.

As shown in FIG. 31, four process units 2301 to 2304 are arranged in this order from an upstream side along a transport path 2320 of a recoding medium 2305 for forming images in yellow, magenta, cyan, and black, respectively. The process units 2301 to 2304 have an identical internal configuration, and the process unit 2303 will be explained as an example.

In the process unit 2303, a photosensitive drum 2303a as an image supporting member is disposed to be rotatable in an arrow direction. Around the photosensitive drum 2303a from an upstream side with respect to rotation of the photosensitive drum 2303a, there are arranged a charging device 2303b for supplying electricity and charging a surface of the photosensitive drum 2303a; and an exposure device 2303c for selectively irradiating light on the surface of the photosensitive drum 2303a thus charged to form a static latent image thereon.

Further, there are arranged a developing device 2303d for attaching toner of cyan to the surface of the photosensitive drum 2303a to produce a toner image; and a cleaning device 2303e for removing toner remaining on the surface of the photosensitive drum 2303a. Note that the photosensitive drum 2303a, the charging device 2303b, the exposure device 2303c, the developing device 2303d, and the cleaning device 2303e are driven with a drive source and a gear (not shown).

In the embodiment, the image forming apparatus 2300 is provided with a sheet cassette 2306 at a lower portion thereof for storing the recording medium 2305 in a stacked state, and a hopping roller 2307 above the sheet cassette 2307 for separating and transporting the recording medium 2305 one by one. At a downstream side of the hopping roller 2307, pinch rollers 2308 and 2309 and register rollers 2310 and 2311 are disposed for sandwiching the recording medium 2305 to correct skew of the recording medium 2305 and transporting the recording medium 2305 to the process units 2301 to 2304. Note that the hopping roller 2307 and the register rollers 2310 and 2311 are driven with a drive source and a gear (not shown).

In the process units 2301 to 2304, transfer rollers 2312 formed of semi-conductive rubber and the likes are disposed at positions facing the photosensitive drums 2301a to 2304a. It is arranged such that a specific potential difference is generated between the surfaces of the photosensitive drums 2301a to 2304a and the transfer rollers 2312, so that toner on the photosensitive drums 2301a to 2304a is attached to the recording medium 2305.

In the embodiment, a fixing device 2313 includes a heating roller and a back-up roller, so that toner transferred to the recording medium 2305 is heated and pressed for fixing. Discharge roller 2314 and 2315 sandwich the recording medium 2305 discharged from the fixing device 2313 with pinch rollers 2316 and 2317, so that the recording medium 2305 is transported to a recording medium stacker portion 2318. Note that the discharge roller 2314 and 2315 are driven with a drive source and a gear (not shown). The LED print head 2200 is disposed in the exposure device 2303c.

An operation of the image forming apparatus 2300 will be explained next. First, the hopping roller 2307 separates and transports the recording medium 2305 stored in the sheet cassette 2306 in a stacked state. Then, the register rollers 2310 and 2311 and the pinch rollers 2308 and 2309 sandwich the recording medium 2305, so that the recording mediums 2305 is transported to the photosensitive drum 2301a and the transfer roller 2312. Then, the photosensitive drum 2301a and the transfer roller 2312 sandwich the recording medium 2305 to transfer a toner image to the recording medium 2305, while the photosensitive drum 2301a rotates to transport the recording medium 2305.

Similar to the process described above, the recording medium 2305 sequentially passes through the process units 2302 to 2304. Accordingly, the developing device 2301d to 2304d develop the latent images formed with the exposure devices 2301c to 2304c to form the toner images in colors, and the toner images are sequentially transferred and overlapped on the recording medium 2305.

After the toner images are overlapped on the recording medium 2305, the fixing device 2313 fixes the toner images. Afterward, the discharge rollers 2314 and 2315 and the pinch rollers 2316 and 2317 sandwich the recording medium 2305 to discharge the recording medium stacker portion 2318 outside the image forming apparatus 2300. Through the process described above, a color image is formed on the recording medium 2305.

As described above, with the LED head using the semiconductor device in the first to eleventh embodiments, it is possible to provide the image forming apparatus with high energy efficiency and low loss due to the wiring patterns.

While the invention has been explained with reference to the example that the LED is formed as the semiconductor element provided in the semiconductor element area in the semiconductor device, the invention is not limited to the embodiments. Instead of the LED element, the semiconductor device may be applicable to a light receiving element; or a semiconductor element other than an optic element; or other variations may be possible.

The disclosure of Japanese Patent Application No. 2006-247275, filed on Sep. 12, 2006, is incorporated in the application by reference.

While the invention has been explained with reference to the specific embodiments of the invention, the explanation is illustrative and the invention is limited only by the appended claims.

What is claimed is:

1. A semiconductor device comprising:
   a substrate;
   a conductive layer disposed on a main surface of the substrate;
   an insulation layer disposed on the conductive layer;
   a plurality of light emitting elements each including a first conductive type semiconductor layer contacting with the insulation layer and a second conductive type semiconductor layer disposed on the first conductive type semiconductor layer, said second conductive type semiconductor layer including a first conductive type semiconductor connection surface and a second conductive type semiconductor connection surface between the first conductive type semiconductor layer; and
   a second conductive side wiring pattern for commonly connecting the second conductive type semiconductor layers of the light emitting elements arranged adjacently so that the second conductive type semiconductor layers are connected to the conductive layer in parallel through the second conductive side wiring pattern, said second conductive side wiring pattern being arranged to contact with the insulation layer and not with the conductive layer between the light emitting elements arranged adjacently.

2. The semiconductor device according to claim 1, wherein said first conductive type semiconductor layer is electrically divided with respect to each of the light emitting elements.

3. The semiconductor device according to claim 2, wherein said insulation layer is disposed between the substrate and the first conductive type semiconductor layer, said substrate being formed of a conductive material, said second conductive side wiring pattern being connected to the substrate.

4. The semiconductor device according to claim 2, wherein said insulation layer is disposed between the conductive layer and the first conductive type semiconductor layer.

5. The semiconductor device according to claim 1, wherein said second conductive side wiring pattern is formed of a transparent electrode.

6. The semiconductor device according to claim 1, further comprising a wiring pattern formed of a transparent electrode and a metal wiring pattern for supplying power to the second conductive side wiring pattern.

7. The semiconductor device according to claim 1, wherein said substrate is formed of a semiconductor compound.

8. The semiconductor device according to claim 1, further comprising an integrated circuit area disposed on the substrate for driving the light emitting elements.

9. A semiconductor device comprising:
   a substrate;
   a conductive layer disposed on a main surface of the substrate;
   an insulation layer covering the conductive layer;
   a plurality of light emitting elements arranged linearly in a row in a first direction, each of the light emitting elements including a first conductive type semiconductor layer disposed on the main surface of the substrate and contacting with the insulation layer, and a second conductive type semiconductor layer disposed on the first conductive type semiconductor layer, said second conductive type semiconductor layer including a first conductive type semiconductor connection surface and a second conductive type semiconductor connection surface between the first conductive type semiconductor layer;
   a first conductive side wiring pattern connected to the first conductive type semiconductor layer, said first conductive side wiring pattern extending in a second direction perpendicular to the first direction; and
   a second conductive side wiring pattern for commonly connecting the second conductive type semiconductor layers in the light emitting elements arranged adjacently in a specific number so that the second conductive type semiconductor layers are connected to the conductive layer in parallel through the second conductive side wiring pattern, said second conductive side wiring pattern being arranged to contact with the insulation layer and not with the conductive layer between the light emitting elements arranged adjacently.

10. The semiconductor device according to claim 1, wherein said second conductive side wiring pattern is situated at a plurality of positions, said first conductive side wiring pattern being connected to at least one of the second conductive side wiring patterns.

11. A light emitting diode (LED) head comprising the semiconductor device according to claim 1, a drive circuit for selectively driving the light emitting elements; and a supporting member for supporting the semiconductor device and the drive circuit, said light emitting elements being formed of light emitting diodes.

12. An image forming apparatus comprising a photosensitive drum; a charging device for charging a surface of the photosensitive drum; the LED head according to claim 11 for selectively exposing the surface of the photosensitive drum to form a static latent image; and a developing device for developing the static latent image.

13. The semiconductor device according to claim 9, further comprising a common wiring pattern connected to the first conductive side wiring pattern, said second conductive side wiring pattern being situated on a side opposite to the common wiring pattern with the light emitting elements inbetween.

14. The semiconductor device according to claim 9, further comprising a second conductive side wiring portion connected to the second conductive side wiring pattern for connecting the second conductive side wiring pattern and an integrated circuit for driving the light emitting elements, said second conductive side wiring portion being situated between the light emitting elements.

15. The semiconductor device according to claim 9, further comprising a second conductive side connection area for connecting the second conductive side wiring pattern and an integrated circuit for driving the light emitting elements, said second conductive side connection area being coated with a material same as that of the second conductive side wiring pattern.

16. The semiconductor device according to claim 9, wherein said second conductive side connection area has a rectangular shape having a side less than 30 μm.

17. The semiconductor device according to claim 9, wherein at least one of said first conductive side wiring pattern and said second conductive side wiring pattern is formed of a material containing aluminum (Al).

18. The semiconductor device according to claim 9, wherein at least one of said first conductive side wiring pattern and said second conductive side wiring pattern is formed of a material containing gold (Au).

19. The semiconductor device according to claim 9, further comprising a first conductive side connection area for connecting the first conductive side wiring pattern and an integrated circuit for driving the light emitting elements.

20. The semiconductor device according to claim 19, wherein said first conductive side connection area is coated with a material same as that of at least one of the first conductive side wiring pattern and the second conductive side wiring pattern.

21. The semiconductor device according to claim 19, wherein said first conductive side connection area is electrically isolated from the integrated circuit.

22. The semiconductor device according to claim 15, further comprising an input pad for inputting a control signal or supplying power to the integrated circuit, said input pad being formed of a material same as that of the second conductive side connection area.

23. The semiconductor device according to claim 19, further comprising an input pad for inputting a control signal or supplying power to the integrated circuit, said input pad being formed of a material same as that of the first conductive side connection area.

24. The semiconductor device according to claim 1, wherein said substrate is formed of a semiconductor compound, said second conductive type semiconductor layer being formed through diffusing a second conductive type impurity into the first conductive type semiconductor layer.

* * * * *